(12) United States Patent
Liaw

(10) Patent No.: US 12,356,708 B2
(45) Date of Patent: Jul. 8, 2025

(54) DIMENSION VARIATIONS IN SEMICONDUCTOR DEVICES AND METHOD FOR MANUFACTURING SAME

(71) Applicant: Taiwan Semiconductor Manufacturing Company, Ltd., Hsin-Chu (TW)

(72) Inventor: Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 583 days.

(21) Appl. No.: 17/518,178

(22) Filed: Nov. 3, 2021

(65) Prior Publication Data

US 2022/0254778 A1    Aug. 11, 2022

Related U.S. Application Data

(60) Provisional application No. 63/146,162, filed on Feb. 5, 2021.

(51) Int. Cl.
*H10D 84/83*    (2025.01)
*H10D 30/43*    (2025.01)
(Continued)

(52) U.S. Cl.
CPC ....... *H10D 84/834* (2025.01); *H10D 30/6211* (2025.01); *H10D 30/6219* (2025.01);
(Continued)

(58) Field of Classification Search
CPC ....... H01L 21/82345; H01L 21/823456; H01L 29/42376; H01L 21/823842; H01L 21/82385; H01L 21/823828; H01L 21/823437; H01L 27/0617; H01L 27/0623; H01L 27/092; H01L 27/0922; H01L 21/823418; H01L 21/823493; H01L 29/165; H01L 29/7848; H01L 21/823814; H01L 29/66636; H01L 29/0843–0886; H01L 21/823468; H01L 21/823864;
(Continued)

(56) References Cited

U.S. PATENT DOCUMENTS 10,163,912 B2 * 12/2018 Lin .................... H01L 28/00
10,332,819 B1   6/2019 Liaw
(Continued)

FOREIGN PATENT DOCUMENTS

CN    102034825 B    6/2013
TW    I701724 B      8/2020

*Primary Examiner* — Sonya McCall-Shepard
(74) *Attorney, Agent, or Firm* — HAYNES AND BOONE, LLP

(57) ABSTRACT

A semiconductor device includes a first transistor and a second transistor. The first transistor includes a first gate structure of a first gate pitch, a first channel region under the first gate electrode, a first source/drain (S/D) feature contacting the first channel region and having a first S/D depth. The second transistor includes a second gate structure of a first gate pitch, a second channel region under the first gate electrode, a second S/D feature contacting the second channel region and having a second S/D depth. The second gate pitch is larger than the first gate pitch. The second S/D depth is larger than the first S/D depth.

20 Claims, 15 Drawing Sheets

(51) Int. Cl.
- *H10D 30/62* (2025.01)
- *H10D 30/69* (2025.01)
- *H10D 62/10* (2025.01)
- *H10D 62/13* (2025.01)
- *H10D 62/822* (2025.01)
- *H10D 62/834* (2025.01)
- *H10D 64/27* (2025.01)
- *H10D 64/66* (2025.01)
- *H10D 84/01* (2025.01)
- *H10D 84/03* (2025.01)
- *H10D 84/85* (2025.01)

(52) U.S. Cl.
CPC ......... *H10D 30/751* (2025.01); *H10D 30/797* (2025.01); *H10D 62/151* (2025.01); *H10D 62/822* (2025.01); *H10D 62/834* (2025.01); *H10D 64/518* (2025.01); *H10D 64/667* (2025.01); *H10D 84/013* (2025.01); *H10D 84/0142* (2025.01); *H10D 84/0156* (2025.01); *H10D 84/0158* (2025.01); *H10D 84/038* (2025.01)

(58) Field of Classification Search
CPC .... H01L 21/823475; H01L 21/823871; H10D 30/6219; H10D 30/797; H10D 62/834; H10D 84/013; H10D 84/017; H10D 30/751; H10D 84/0156; H10D 64/518; H10D 84/0142; H10D 84/0172; H10D 84/0135; H10D 84/834; H10D 30/6211; H10D 84/0158; H10D 84/0193; H10D 84/853

See application file for complete search history.

(56) References Cited

U.S. PATENT DOCUMENTS

2010/0327367 A1* 12/2010 Richter ................... H01L 21/84
  257/369
2017/0373189 A1* 12/2017 Lee ....................... H01L 21/845

\* cited by examiner

DIMENSION VARIATIONS IN SEMICONDUCTOR DEVICES AND METHOD FOR MANUFACTURING SAME

PRIORITY

This is a non-provisional application of and claims benefit of U.S. Provisional Patent Application Ser. No. 63/146,162, filed Feb. 5, 2021, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as IC technologies progress towards smaller technology nodes, multi-gate metal-oxide-semiconductor field effect transistors (multi-gate MOSFETs, or multi-gate devices) have been introduced to improve gate control by increasing gate-channel coupling, reducing off-state current, and reducing short-channel effects (SCEs). A multi-gate transistor generally refers to a device having a gate structure (also known as gate stack), or portion thereof, disposed over more than one side of a channel region. Fin-like field effect transistors (FinFETs) and multi-bridge-channel (MBC) transistors are examples of multi-gate transistors that have become popular and promising candidates for high performance and low leakage applications. A FinFET has an elevated channel wrapped by a gate structure on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

Multi-gate transistors in different regions of an IC chip or in different portions of a circuit may need to meet different design needs, such as high speed, high circuit density, and low leakage. These different design needs require the multi-gate transistors to have different constructions. At the same time, it is advantageous to have similar processes and similar process windows to fabricate these different transistors to reduce cost and improve yield. Accordingly, while existing semiconductor manufacturing flows are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
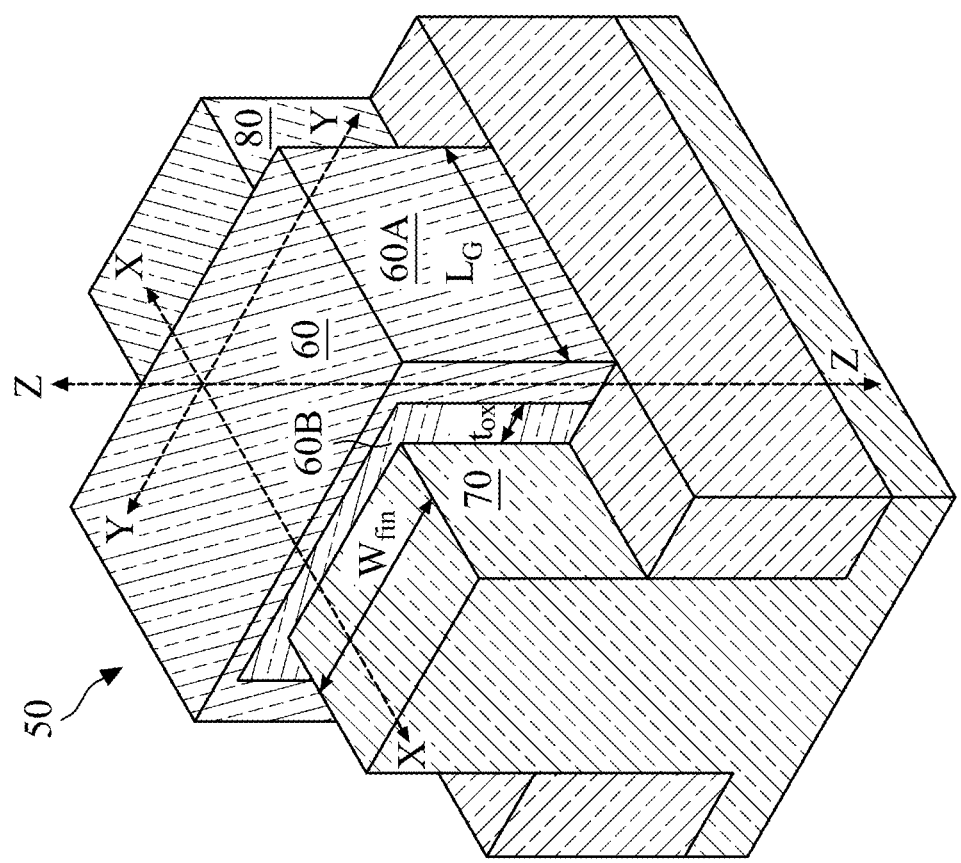
FIG. 1 illustrates a perspective view of an example FinFET device.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and the fabrication thereof, and more particularly to integrate circuit (IC) chips having multi-gate transistors with different constructions suiting different design needs, such as high speed, high circuit density, and low leakage needs, in one IC chip. Various embodiments that include fin-like field effect transistor (FinFET) device as example multi-gate transistors are illustrated in the figures, but the present disclosure is not so limited and may be applicable to other multi-gate transistors, such as MBC transistors. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The use of FinFET devices has been gaining popularity in the semiconductor industry. Referring to FIG. 1, which illustrates a perspective view of an example FinFET device 50. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1. The fin has a fin width $W_{fin}$ measured along a Y-direction that is orthogonal to the X-direction. In some embodiments, the fin width $W_{fin}$ of the fin may be defined as a width of the top surface of the fin measured along the Y-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

$L_G$ denotes a length (or width, depending on the perspective) of the gate 60 measured in the X-direction. The gate 60 may include a gate electrode component 60A and a gate dielectric component 60B. The gate dielectric 60B has a thickness $t_{ox}$, measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin being wrapped around by the gate 60 serves as a channel of the FinFET device 50. The effective channel length of the FinFET device 50 is determined by the dimensions of the fin.

Figure 2:
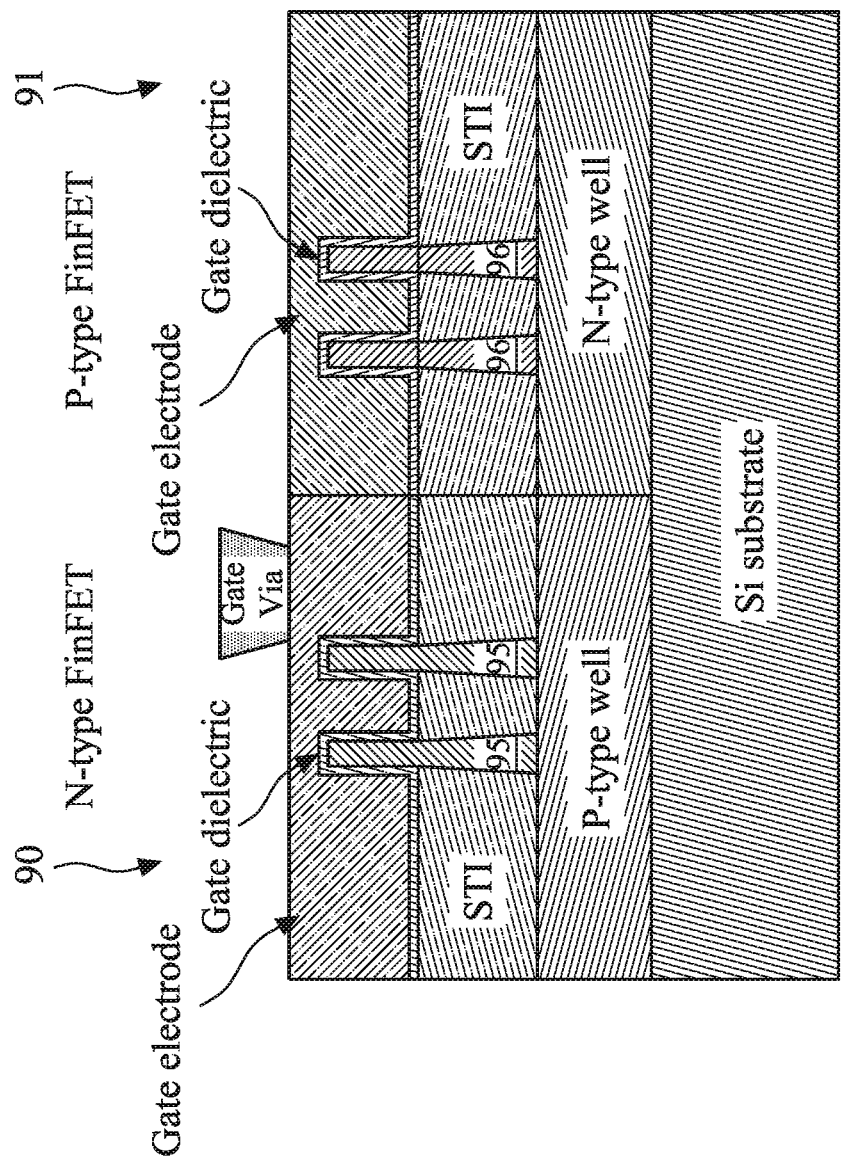
FIG. 2 illustrates a diagrammatic cross-sectional side view of FinFET transistors in a CMOS configuration.

FIG. 2 illustrates a diagrammatic cross-sectional side view of FinFET transistors in a CMOS configuration. The CMOS FinFET includes a substrate, for example a silicon substrate. An N-type well and a P-type well are formed in the substrate. A dielectric isolation structure such as a shallow trench isolation (STI) is formed over the N-type well and the P-type well. A P-type FinFET 91 is formed over the N-type well, and an N-type FinFET 90 is formed over the P-type well. The P-type FinFET 91 includes fins 96 that protrude upwardly out of the STI, and the N-type FinFET 90 includes fins 95 that protrude upwardly out of the STI. The fins 96 include the channel regions of the P-type FinFET 91, and the fins 95 include the channel regions of the N-type FinFET 90. In some embodiments, the fins 96 are comprised of silicon germanium, and the fins 95 are comprised of silicon. In the illustrated embodiment, a bottom portion (below STI) of the fins 96 are comprised of silicon, yet a top portion (above STI) of the fins 96 are comprised of silicon germanium as channels, for example, being formed by recessing silicon fins and followed by epitaxially growing silicon germanium as top portions. A gate dielectric is formed over the fins 95-96 and over the STI, and a gate electrode is formed over the gate dielectric. In some embodiments, the gate dielectric includes a high-k dielectric material, and the gate electrode includes a metal gate electrode. In some other embodiments, the gate dielectric may include SiON, and the gate electrode may include polysilicon. A gate via is formed on the gate electrode to provide electrical connectivity to the gate.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

Figure 3:
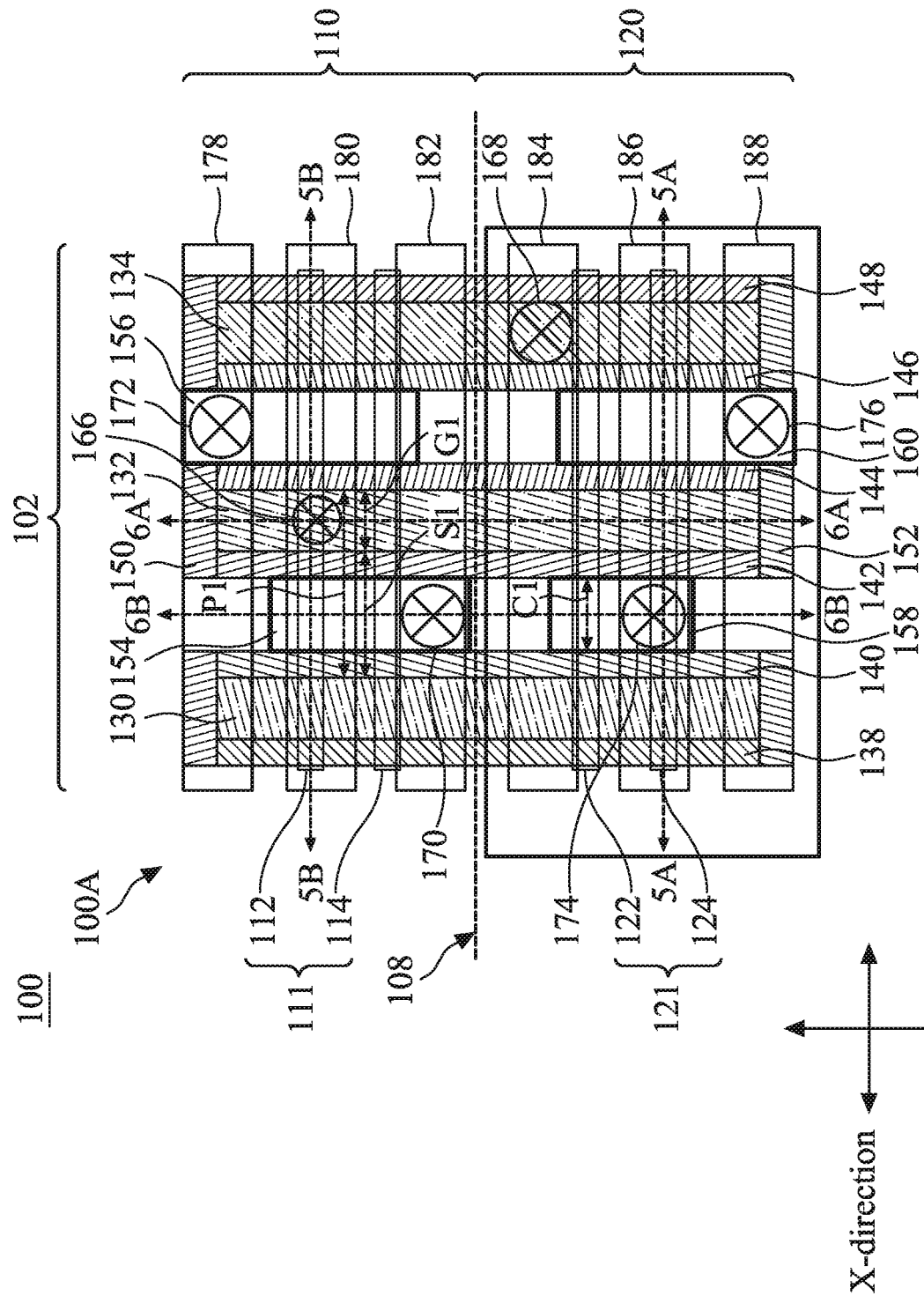
FIG. 3 illustrates a top view of a layout of a first circuit of a semiconductor device.
Figure 4:
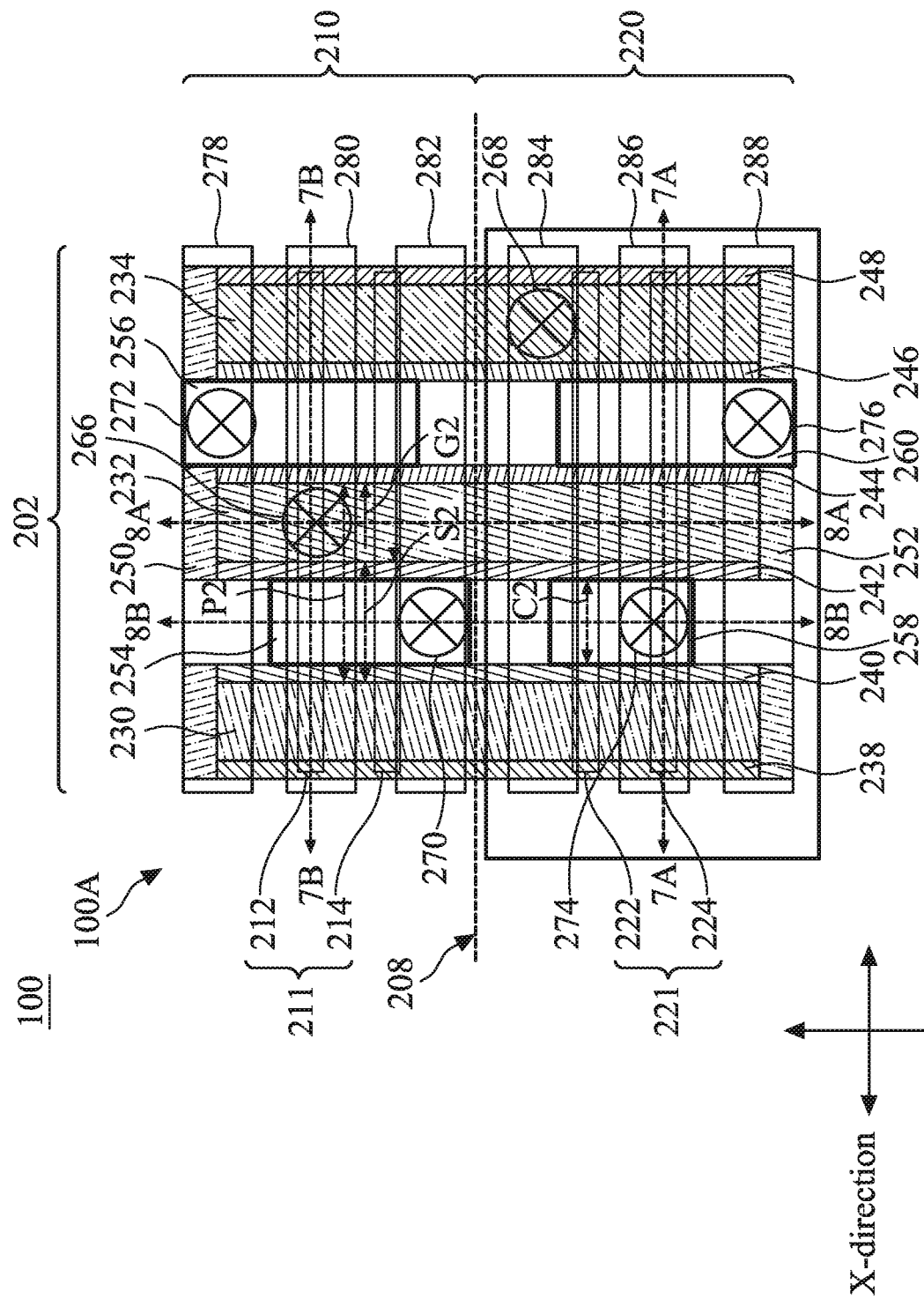
FIG. 4 illustrates a top view of a layout of a second circuit of the semiconductor device.

Reference is made to FIGS. 3 and 4. FIG. 3 illustrates a top view of a layout of a first circuit 102 of a semiconductor device 100. FIG. 4 illustrates a top view of a layout of a second circuit 202 of the semiconductor device 100. Illustrations in FIGS. 3 and 4 can collectively serve as a top view of a layout 100A corresponding to the semiconductor device 100 according to some embodiments of the present disclosure. The semiconductor device 100 includes a first circuit 102 and a second circuit 202. The first circuit 102 and the second circuit 202 are spaced from each other by a region which includes, for example, an isolation structure. In some embodiments, the first circuit 102 may serve as a partial layout of a first device of the semiconductor device 100, and the second circuit 202 may serve as a partial layout of a second device of the semiconductor device 100. As will be discussed in further details below, with respect to the first circuit 102 and the second circuit 202 of the semiconductor device 100, the first circuit 102 can be used in a high-density memory region and the second circuit 202 can be used in a speed-driven logic circuit. In some embodiments, at least one portion of the layout 100A may serve as a partial layout of a static random access memory (SRAM) circuit.

The first circuit 102 includes a first active area region 111 with fins 112 and 114, a second active area region 121 with fins 122 and 124, a plurality of gate electrodes 130, 132, and 134, a plurality of spacers 138, 140, 142, 144, 146, and 148, a plurality of contact areas 154, 156, 158, and 160, a plurality of gate vias 166 and 168, a plurality of source/drain (S/D) vias 170, 172, 174, and 176, and a plurality of conductive lines 178, 180, 182, 184, 186, and 188.

The first and second active area regions 111 and 121 extend along a X-direction of the layout 100A. The X-direction of the layout 100A can be referred to as the X-direction of FIG. 1. In some embodiments, the first and second active area regions 111 and 121 are also referred to as oxide-definition (OD) regions. Example materials of the first and second active area regions 111 and 121 include, but are not limited to, semiconductor materials doped with various types of p-dopants and/or n-dopants. In some embodiments, the first and second active area regions 111 and 121 include dopants of the same type. In some embodiments, one of the first and second active area regions 111 and 121 includes dopants of a type different from a type of dopants of another one of the first and second active area regions 111 and 121. The first and second active area regions 111 and 121 are isolated from each other by one or more isolation structures as described herein. The first and second active area regions 111 and 121 are within corresponding well regions. For example, the first active area region 111 is within a well region 110 which is a p-well region in one or more embodiments, and the second active area region 121 is within a well region 120 which is an n-well region in one or more embodiments. The described conductivity of the well regions 110 and 120 is an example. Other arrangements are within the scope of various embodiments.

The p-well region 110 and the n-well region 120 are on opposite sides of an imaginary line 108 which divides the semiconductor device into separate regions for different types of devices or transistors. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, multi-bridge-channel (MBC) transistors such as surrounding gate transistors (SGT) or gate-all-around (GAA) transistors, or the like. In the example configuration in FIG. 3, the p-well region 110 is a region for forming n-channel metal-oxide semiconductor (NMOS) transistors, and the n-well region 120 is a region for forming p-channel metal-oxide semiconductor (PMOS) transistors. Each of the first and second active area regions 111 and 121 includes one or more fins to form FinFETs as described in FIGS. 1 and 2. For example, the first active area region 111 comprises the two fins 112, 114 and the second active area region 121 comprises the two fins 122, 124. The fins 112, 114, 122, 124 are isolated from each other by one or more isolation structures as described herein. Other numbers of fins in each of the first and second active area regions 111 and 121 are within the scope of various embodiments. The described FinFET configuration is an example. Other arrangements are within the scope of various embodiments. For example, in one or more embodiments, the first and second active area regions 111 and 121 do not include fins and are configured for forming planar MOSFET transistors. For another example, in one or more embodiments, the first and second active area regions 111 and 121 include vertically stacked channel members, such as nanowires or nanosheets, and are configured for forming MBC transistors The fins 112, 114, 122, 124 are extend in an elongated manner in the X-direction. In some embodiments, the fins 112, 114 are parts of the NMOSFET, and the fins 122, 124 are parts of the PMOSFET. The NMOSFET fins 112, 114 are located over the p-well region 110, whereas the PMOSFET fins 122, 124 are located over the n-well region 120. In some embodiments, the NMOSFET fins 112, 114 comprise a non-germanium-containing semiconductor material, for example Si, but the PMOSFET fins 122, 124 comprise a silicon germanium (SiGe) material (for strain effect enhancement). In some embodiment, at least one of the fins 112, 114 of the first active area region 111 and the fins 122, 124 of the second active area region 121 has a width measured along the Y-direction as described with respect to the fin width $W_{fin}$ in FIG. 1.

The gate electrodes 130, 132, 134 extend along an Y-direction of the layout 100A. The Y-direction of the layout 100A can be referred to as the Y-direction of FIG. 1. The gate electrodes 130, 132, 134 are across first and second active area regions 111 and 121. Example materials of the gate electrodes 130, 132, 134 include, but are not limited to, polysilicon and metal. Other materials are within the scope of various embodiments. The gate electrodes 130, 132, 134 and the corresponding first and second active area regions 111 and 121 form one or more transistors in the first circuit 102. In the example configuration in FIG. 3, a transistor may be formed by the gate electrode 132 and the first active area region 111, and such transistor may include a gate, a drain and a source. The gate of the transistor is formed by the gate electrode 132. One of the drain or the source (referred to herein as "source/drain" or "S/D") of the transistor is defined by a region of the first active area region 111 on one side (e.g., the right side in FIG. 3) of the gate electrode 132. The other source/drain of the transistor is defined by another region of the first active area region 111 on the opposite side (e.g., the left side in FIG. 3) of the gate electrode 132. For another example, a further transistor may be formed by the gate electrode 132 and the second active area region 121. In at least one embodiment, such further transistors are formed by the gate electrode 130 and the corresponding first and second active area regions 111 and 121. One or more of the gate electrodes 130, 132, 134 are coupled to other circuitry of the semiconductor device 100 by corresponding gate vias. For example, the gate vias 166, 168 may be respectively formed on the gate electrodes 132, 134 and configured to electrically couple to the gate electrodes 132, 134 to other circuitry. In some embodiments, the gate vias 166, 168 overlap the corresponding gate electrodes 132, 134 and respectively have vertical projections projected on the corresponding gate electrodes 132, 134. The gate vias 166, 168 may be in a circle shape.

In some embodiment, at least one of the gate electrodes 130, 132, 134 has a first width measured along the X-direction as described with respect to the length $L_G$ of the gate 60 in FIG. 1. The first width of at least one of the gate electrodes 130, 132, 134 may define a first gate length. For example, the gate electrode 132 crossing over the fin 112 has a first gate length G1 along a longitudinal direction of at least one of the fins 112, 114, 122, 124 (i.e., the X-direction of the layout 100A). In some embodiments, a pair of the adjacent gate electrodes 130, 132, 134 are spaced from each other by a first spacing measured along the X-direction. For example, the adjacent gate electrodes 130, 132 are spaced from each other by the first spacing S1. The first spacing S1 can be referred to as a distance that is measured along the X-direction and between boundaries of the adjacent gate electrodes 130, 132. For example, one side (e.g., the right side in FIG. 3) of the boundary of the gate electrode 130 and the opposite side (e.g., the left side in FIG. 3) of the boundary of the gate electrode 132 are spaced from each other by the first spacing S1. In some embodiments, the gate electrodes 130, 132, 134 can be arranged along the X-direction by a first pitch P1, which can be defined by a sum of the first width and the first spacing. For example, the first pitch P1 is equal to a sum of the first width G1 and the first spacing S1, and thus the first pitch P1 is equal to a distance measured along the X-direction from one side (e.g., the right side in FIG. 3) of the boundary of the gate electrode 130 and the same side (e.g., the right side in FIG. 3) of the boundary of the gate electrode 132.

The spacers 138, 140, 142, 144, 146, 148 are arranged along sides of the corresponding gate electrodes 130, 132, 134. For example, the spacers 142 and 144 are arranged along longitudinal sides of the gate electrode 132 in the X-direction, and the spacers 146 and 148 are arranged along longitudinal sides of the gate electrode 134 in the X-direction. The spacers 138, 140, 142, 144, 146, 148 include one or more dielectric materials for electrically isolating the corresponding gate electrodes from unintended electrical contact. Example dielectric materials of the spacers include, but are not limited to, silicon nitride, oxynitride and silicon carbide. In at least one embodiment, one or more of the spacers 138, 140, 142, 144, 146, 148 have a tapered profile as described herein.

The contact areas 154, 156, 158, 160 overlap the corresponding first and second active area regions 111 and 121. For example, the contact areas 154, 156 overlap the first active area region 111, and the contact areas 158, 160 overlap the second active area region 121. The contact areas 154, 156, 158, 160 are configured to electrically couple the underlying source/drains of the corresponding transistors with each other or with other circuitry of the semiconductor device 100. In some embodiments, a plurality of contact plugs are disposed within the corresponding contact areas 154, 156, 158, 160. In the example configuration in FIG. 3, boundaries of one or more of the contact areas 154, 156, 158, 160 are spaced from boundaries of the spacers 138, 140, 142, 144, 146, 148. For example, a left edge of the contact area 156 is spaced in the X-direction from an adjacent right edge of the spacer 144, and a right edge of the contact area 156 is spaced in the X-direction from an adjacent left edge of the spacer 146. Other arrangements are within the scope of various embodiments. For example, in one or more embodiments, one or more of the contact areas are self-aligned contacts (SAC) having boundaries defined at least partially by boundaries of the spacers 138, 140, 142, 144, 146, 148. In some embodiments, the contact areas 154, 156, 158, 160 are rectangular. For example, at least one of the contact areas 154, 156, 158, 160 has a slot shape having a pair of longer sides and a pair of shorter sides, in which a ratio of a length of the longer sides to a length of the shorter sides is in a range from 2 to 30. Such ratio may be advantageous to avoid yield loss. For example, a planarization process, such as a chemical mechanical polishing (CMP) process can be performed smoothly. In some embodiment, at least one of the contact areas 154, 156, 158, 160 has a first contact width measured along the X-direction. For example, each of the contact areas 154, 156, 158, 160 has the first contact width C1 measured along the X-direction.

The S/D vias 170, 172, 174, 176 respectively overlap with the contact areas 154, 156, 158, 160 and respectively have vertical projections projected on the contact areas 154, 156, 158, 160. The S/D vias 170, 172, 174, 176 are in a circle shape. In the layout 100A, at least one of the S/D vias 170, 172, 174, 176 is circular and has a first circular area. The S/D vias 170, 172, 174, 176 can be configured to electrically couple to the contact areas 154, 156, 158, 160 to other circuitry.

The conductive lines 178, 180, 182, 184, 186, 188 extend along the X-direction of the layout 100A. In some embodiments, the conductive lines 178, 180, 182, 184, 186, 188 are in a first interconnection layer of the layout 100A, such as a first metal layer (M1). The conductive lines 178, 180, 182, 184, 186, 188 overlap and are electrically connected to corresponding elements. For example, the conductive line 180 overlaps with the gate electrode 132, and the conductive line 182 overlaps with the contact area 154. In some embodiments, the conductive line 180 is electrically connected to the gate electrode 132 through the gate via 166. In some embodiments, the conductive line 182 is electrically connected to the contact area 154 through the S/D via 170.

The second circuit 202 includes a third active area region 211 with fins 212 and 214, a fourth active area region 221 with fins 222 and 224, a plurality of gate electrodes 230, 232, and 234, a plurality of spacers 238, 240, 242, 244, 246, and 248, a plurality of contact areas 254, 256, 258, and 260, a plurality of gate vias 266 and 268, a plurality of source/drain (S/D) vias 270, 272, 274, and 276, and a plurality of conductive lines 278, 280, 282, 284, 286, and 288.

The third and fourth active area regions 211 and 221 extend along a X-direction of the layout 100A. The X-direction of the layout 100A can be referred to as the X-direction of FIG. 1. In some embodiments, the third and fourth active area regions 211 and 221 are also referred to as oxide-definition (OD) regions. Example materials of the third and fourth active area regions 211 and 221 include, but are not limited to, semiconductor materials doped with various types of p-dopants and/or n-dopants. In some embodiments, the third and fourth active area regions 211 and 221 include dopants of the same type. In some embodiments, one of the third and fourth active area regions 211 and 221 includes dopants of a type different from a type of dopants of another one of the third and fourth active area regions 211 and 221. The third and fourth active area regions 211 and 221 are isolated from each other by one or more isolation structures as described herein. The third and fourth active area regions 211 and 221 are within corresponding well regions. For example, the third active area region 111 is within a well region 210 which is a p-well region in one or more embodiments, and the fourth active area region 221 is within a well region 220 which is an n-well region in one or more embodiments. The described conductivity of the well regions 210 and 220 is an example. Other arrangements are within the scope of various embodiments.

The p-well region 210 and the n-well region 220 are on opposite sides of an imaginary line 208 which divides the semiconductor device into separate regions for different types of devices or transistors. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, multi-bridge-channel (MBC) transistors such as surrounding gate transistors (SGT) or gate-all-around (GAA) transistors, or the like. In the example configuration in FIG. 4, the p-well region 210 is a region for forming n-channel metal-oxide semiconductor (NMOS) transistors, and the n-well region 220 is a region for forming p-channel metal-oxide semiconductor (PMOS) transistors. Each of the third and fourth active area regions 211 and 221 includes one or more fins to form FinFETs as described in FIGS. 1 and 2. For example, the third active area region 211 comprises the two fins 212, 214 and the fourth active area region 221 comprises the two fins 222, 224. The fins 212, 214, 222, 224 are isolated from each other by one or more isolation structures as described herein. Other numbers of fins in each of the third and fourth active area regions 211 and 221 are within the scope of various embodiments. The described FinFET configuration is an example. Other arrangements are within the scope of various embodiments. For example, in one or more embodiments, the third and fourth active area regions 211 and 221 do not include fins and are configured for forming planar MOSFET transistors. For another example, in one or more embodiments, the third and fourth active area regions 211 and 221 include vertically stacked channel members, such as nanowires or nanosheets, and are configured for forming MBC transistors.

The fins 212, 214, 222, 224 are extend in an elongated manner in the X-direction. In some embodiments, the fins 212, 214 are parts of the NMOSFET, and the fins 222, 224 are parts of the PMOSFET. The NMOSFET fins 212, 214 are located over the p-well region 210, whereas the PMOSFET fins 222, 224 are located over the n-well region 220. In some embodiments, the NMOSFET fins 212, 214 comprise a non-germanium-containing semiconductor material, for example Si, but the PMOSFET fins 222, 224 comprise a silicon germanium (SiGe) material (for strain effect enhancement). In some embodiment, at least one of the fins 212, 214 of the third active area region 211 and the fins 222, 224 of the fourth active area region 221 has a width measured along the Y-direction as described with respect to the fin width $W_{fin}$ in FIG. 1.

The gate electrodes 230, 232, 234 extend along an Y-direction of the layout 100A. The Y-direction of the layout 100A can be referred to as the Y-direction of FIG. 1. The gate electrodes 230, 232, 234 are across third and fourth active area regions 211 and 221. Example materials of the gate electrodes 230, 232, 234 include, but are not limited to, polysilicon and metal. Other materials are within the scope of various embodiments. The gate electrodes 230, 232, 234 and the corresponding third and fourth active area regions 211 and 221 form one or more transistors in the second circuit 202. In the example configuration in FIG. 4, a transistor may be formed by the gate electrode 232 and the third active area region 211, and such transistor may include a gate, a drain and a source. The gate of the transistor is formed by the gate electrode 232. One of the source/drain of the transistor is defined by a region of the third active area region 111 on one side (e.g., the right side in FIG. 4) of the gate electrode 232. The other source/drain of the transistor is defined by another region of the third active area region 211 on the opposite side (e.g., the left side in FIG. 4) of the gate electrode 232. For another example, a further transistor may be formed by the gate electrode 232 and the fourth active area region 221. In at least one embodiment, such further transistors are formed by the gate electrode 230 and the corresponding third and fourth active area regions 211 and 221. One or more of the gate electrodes 230, 232, 234 are coupled to other circuitry of the semiconductor device 100 by corresponding gate vias. For example, the gate vias 266, 268 may be respectively formed on the gate electrodes 232, 234 and configured to electrically couple to the gate electrodes 232, 234 to other circuitry. In some embodiments, the gate vias 266, 268 overlap the corresponding gate electrodes 232, 234 and respectively have vertical projections projected on the corresponding gate electrodes 232, 234. The gate vias 266, 268 may be in a circle shape.

In some embodiment, at least one of the gate electrodes 230, 232, 234 has a second width measured along the X-direction as described with respect to the length $L_G$ of the gate 60 in FIG. 1. The second width of at least one of the gate electrodes 230, 232, 234 may define a second gate length. For example, the gate electrode 232 crossing over the fin 212 has a second gate length G2 along a longitudinal direction of at least one of the fins 212, 214, 222, 224 (i.e., the X-direction of the layout 100A). In some embodiments, a pair of the adjacent gate electrodes 230, 232, 234 are spaced from each other by a second spacing measured along the X-direction. For example, the adjacent gate electrodes 230, 232 are spaced from each other by the second spacing S2. The second spacing S2 can be referred to as a distance that is measured along the X-direction and between boundaries of the adjacent gate electrodes 230, 232. For example, one side (e.g., the right side in FIG. 4) of the boundary of the gate electrode 230 and the opposite side (e.g., the left side in FIG. 4) of the boundary of the gate electrode 232 are spaced from each other by the second spacing S2. In some embodiments, the gate electrodes 230, 232, 234 can be arranged along the X-direction by a second pitch P2, which can be defined by a sum of the second width and the second spacing. For example, the second pitch P2 is equal to a sum of the second width G2 and the second spacing S2, and thus the second pitch P2 is equal to a distance measured along the X-direction from one side (e.g., the right side in FIG. 4) of the boundary of the gate electrode 230 and the same side (e.g., the right side in FIG. 4) of the boundary of the gate electrode 232.

The spacers 238, 240, 242, 244, 246, 248 are arranged along sides of the corresponding gate electrodes 230, 232, 234. For example, the spacers 242 and 244 are arranged along longitudinal sides of the gate electrode 232 in the X-direction, and the spacers 246 and 248 are arranged along longitudinal sides of the gate electrode 234 in the X-direction. The spacers 238, 240, 242, 244, 246, 248 include one or more dielectric materials for electrically isolating the corresponding gate electrodes from unintended electrical contact. Example dielectric materials of the spacers include, but are not limited to, silicon nitride, oxynitride and silicon carbide. In at least one embodiment, one or more of the spacers 238, 240, 242, 244, 246, 248 have a tapered profile as described herein.

The contact areas 254, 256, 258, 260 overlap the corresponding third and fourth active area regions 211 and 221. For example, the contact areas 254, 256 overlap the third active area region 211, and the contact areas 258, 260 overlap the fourth active area region 221. The contact areas 254, 256, 258, 260 are configured to electrically couple the underlying source/drains of the corresponding transistors with each other or with other circuitry of the semiconductor device 100. In some embodiments, a plurality of contact plugs are disposed within the corresponding contact areas 254, 256, 258, 260. In the example configuration in FIG. 4, boundaries of one or more of the contact areas 254, 256, 258, 260 are spaced from boundaries of the spacers 238, 240, 242, 244, 246, 248. For example, a left edge of the contact area 256 is spaced in the X-direction from an adjacent right edge of the spacer 244, and a right edge of the contact area 256 is spaced in the X-direction from an adjacent left edge of the spacer 246. Other arrangements are within the scope of various embodiments. For example, in one or more embodiments, one or more of the contact areas are self-aligned contacts (SAC) having boundaries defined at least partially by boundaries of the spacers 238, 240, 242, 244, 246, 248. In some embodiments, the contact areas 254, 256, 258, 260 are rectangular. For example, at least one of the contact areas 254, 256, 258, 260 has a slot shape having a pair of longer sides and a pair of shorter sides, in which a ratio of a length of the longer sides to a length of the shorter sides is in a range from 2 to 30. Such ratio may be advantageous to avoid yield loss. For example, a planarization process, such as a chemical mechanical polishing (CMP) process can be performed smoothly. In some embodiment, at least one of the contact areas 254, 256, 258, 260 has a second contact width measured along the X-direction. For example, each of the contact areas 154, 156, 158, 160 has the second contact width C2 measured along the X-direction.

The S/D vias 270, 272, 274, 276 respectively overlap with the contact areas 254, 256, 258, 260 and respectively have vertical projections projected on the contact areas 254, 256, 258, 260. The S/D vias 270, 272, 274, 276 are in a circle shape. In the layout 100A, at least one of the S/D vias 270, 272, 274, 276 is circular and has a second circular area. The S/D vias 270, 272, 274, 276 can be configured to electrically couple to the contact areas 254, 256, 258, 260 to other circuitry.

The conductive lines 278, 280, 282, 284, 286, 288 extend along the X-direction of the layout 100A. In some embodiments, the conductive lines 278, 280, 282, 284, 286, 288 are in the first interconnection layer of the layout 100A, such as the first metal layer (M1). The conductive lines 278, 280, 282, 284, 286, 288 overlap and are electrically connected to corresponding elements. For example, the conductive line 280 overlaps with the gate electrode 232, and the conductive line 282 overlaps with the contact area 254. In some embodiments, the conductive line 280 is electrically connected to the gate electrode 232 through the gate via 266. In some embodiments, the conductive line 282 is electrically connected to the contact area 254 through the S/D via 270.

Figure 5A:
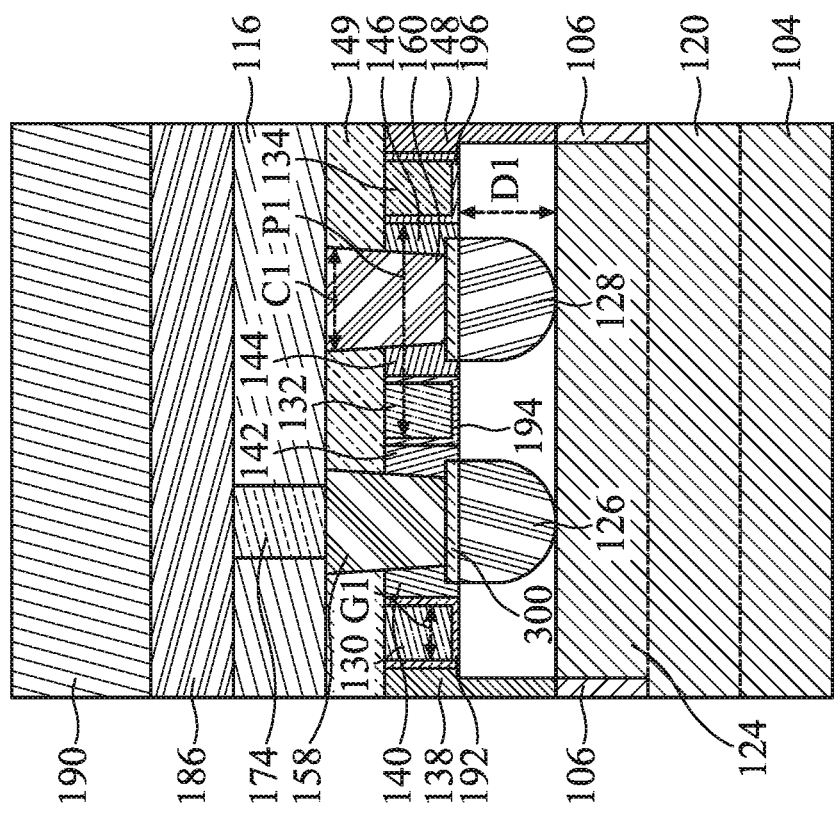
FIGS. 5A, 5B, 6A, and 6B are cross-section views of the semiconductor device having the layout of the first circuit.
Figure 5B:
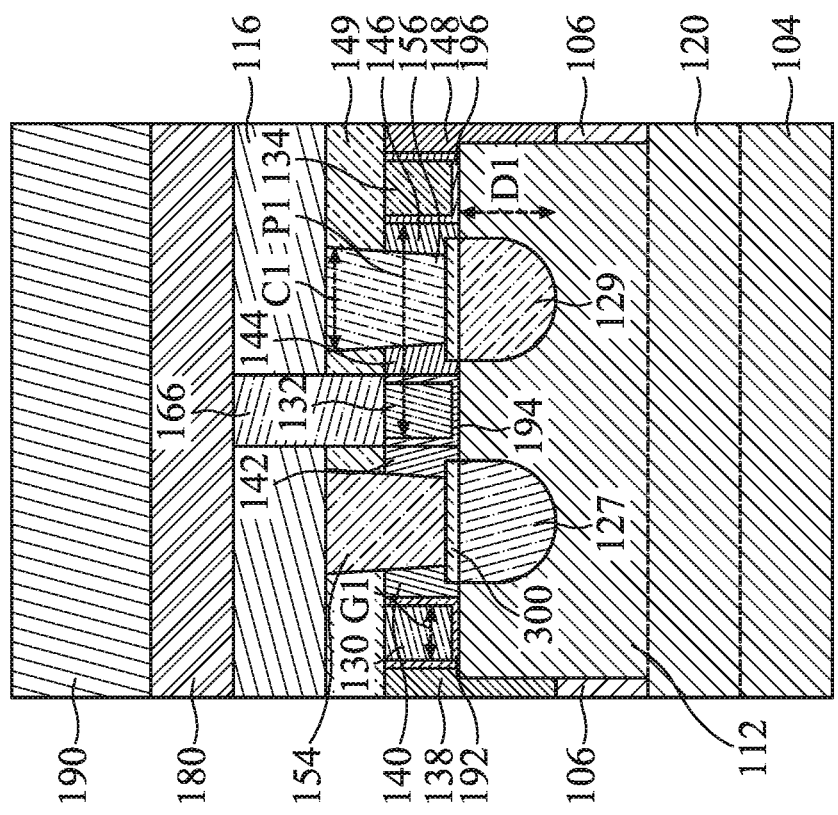
Figure 6A:
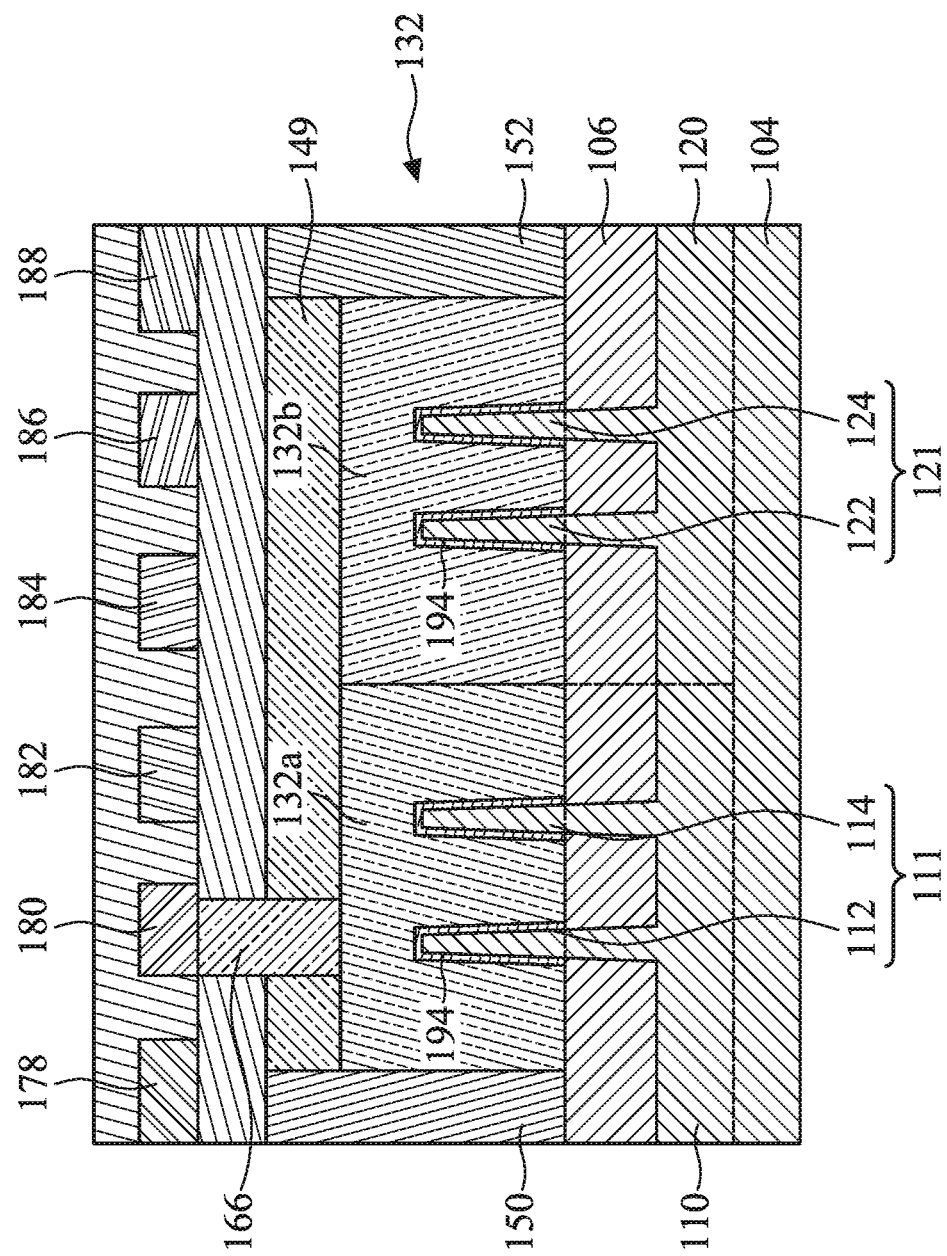
Figure 6B:
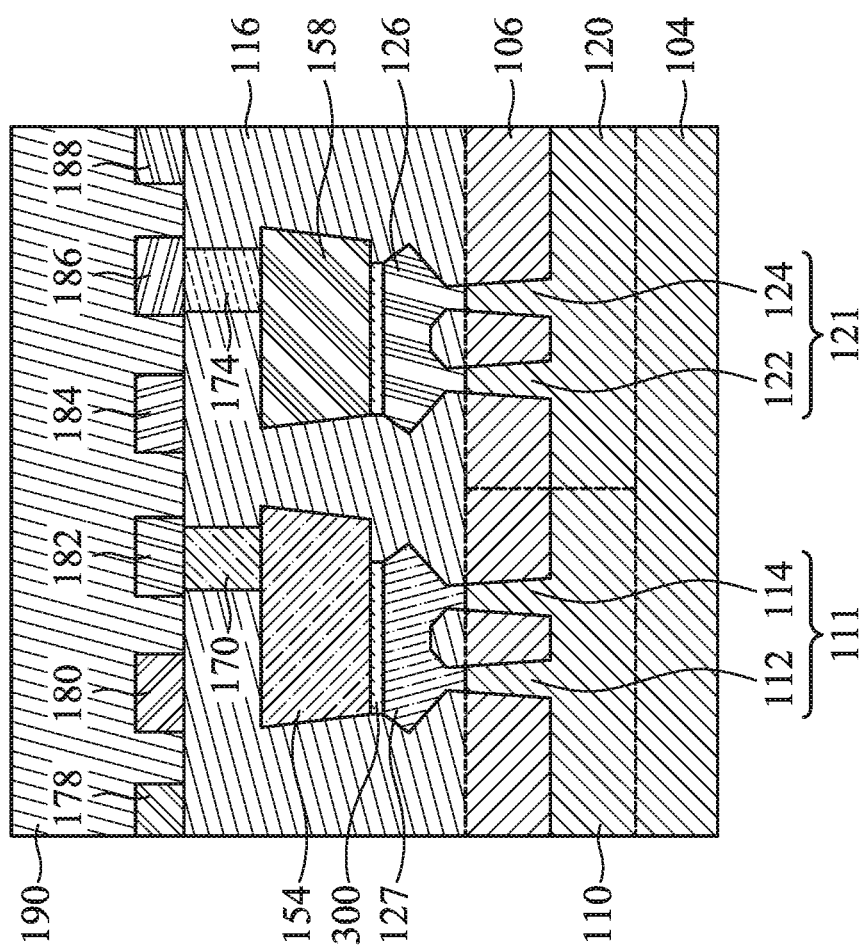

Reference is made to FIGS. 5A, 5B, 6A, and 6B. FIGS. 5A, 5B, 6A, and 6B are cross-section views of the semiconductor device 100 having the layout 100A. The cross-section view in FIG. 5A is taken along line 5A-5A in FIG. 3, which is a cut along a fin lengthwise direction in an n-well region 120. The cross-section view in FIG. 5B is taken along line 5B-5B in FIG. 3, which is a cut along a fin lengthwise direction in a p-well region 110. The cross-section view in FIG. 6A is taken along line 6A-6A in FIG. 3, which is a cut in a channel region across the well regions 110 and 120. The cross-section view in FIG. 6B is taken along line 6B-6B in FIG. 3, which is a cut in a source/drain region across the well regions 110 and 120. The configuration of the semiconductor device 100 is described herein with respect to FIGS. 5A-6B. The structures shown in FIGS. 5A-6B can be formed by modelling in a layout as depicted in FIG. 3, and then physical elements or layers are formed by using the gate electrode and the gate contact as patterns.

As illustrated in FIGS. 5A-6B, the semiconductor device 100 comprises a substrate 104 over which various elements of the semiconductor device 100 are formed. The elements of the semiconductor device 100 include active elements and/or passive elements. In at least one embodiment, active elements are arranged in a circuit region of the semiconductor device to provide one or more functions and/or operations intended to be performed by the semiconductor device. In at least one embodiment, the semiconductor device further comprises a non-circuit region, e.g., a sealing region, that extends around and protects the circuit region. Examples of active elements include, but are not limited to, transistors and diodes. Examples of transistors are described herein with respect to FIG. 3. Examples of passive elements include, but are not limited to, capacitors, inductors, fuses, and resistors. A plurality of metal layers and via layers are alternatingly formed over the substrate 104 to electrically couple the elements of the semiconductor device 100 with each other and/or with external devices. The substrate 104 comprises, in at least one embodiment, a silicon substrate. The substrate 104 comprises, in at least one embodiment, silicon germanium (SiGe), Gallium arsenic, P-type doped Si, N-type doped Si, or suitable semiconductor materials. For example, semiconductor materials including group III, group IV, and group V elements are within the scope of various embodiments. In some embodiments, the substrate 104 further includes one or more other features, such as various doped regions, a buried layer, and/or an epitaxy (epi) layer. In some embodiments, the substrate 104 comprises a semiconductor on insulator, such as silicon on insulator (SOI). In some embodiments, the substrate 104 includes a doped epi layer, a gradient semiconductor layer, and/or a semiconductor layer overlying another semiconductor layer of a different type such as a silicon layer on a silicon germanium layer.

The semiconductor device 100 further comprises one or more well regions over the substrate 104. In the example configuration in FIGS. 5A and 5B, the n-well region 120 is over the substrate 104, as described with respect to FIG. 3. In the example configuration in FIGS. 6A and 6B, the n-well region 120 and p-well region 110 are over the substrate 104, as described with respect to FIG. 3.

The semiconductor device 100 further comprises one or more isolation structures over and around the well regions 110, 120. In the example configuration in FIGS. 5A-6B, an isolation structure 106 is over the well regions 110, 120. The isolation structure 106 electrically isolates various elements of the semiconductor device 100 from each other. For example, as illustrated in FIGS. 6A and 6B, the isolation structure 106 electrically isolates the fins 112 and 114 in the first active area region 111 from the fins 122 and 124 in the second active area region 121. In the cross-section in FIGS. 5A and 5B, the isolation structure 106 has a thickness less than the fin 124. In at least one embodiment, the isolation structure 106 comprises one or more shallow trench isolation (STI) regions. Example materials of the STI regions include, but are not limited to, silicon oxide, silicon nitride, silicon oxynitride, fluoride-doped silicate, and/or any other low k dielectric materials. In some embodiments, the STI thickness is from 50 nm to 200 nm.

The semiconductor device 100 further comprises active area regions, gate electrodes, and corresponding spacers over the isolation structure. In the example configuration in FIGS. 5A-6B, the first and second active area regions 111, 121, gate electrodes 130, 132, 134, and corresponding spacers 138, 140, 142, 144, 146, 148, gate end dielectric 150, 152 (best seen in FIG. 6A) over the isolation structure 106. In the example configuration in FIGS. 4 and 5A-B, the gate electrodes 130, 132, 134, and the corresponding spacers 138, 140, 142, 144, 146, 148 are over the isolation structure 106. Other arrangements are within the scope of various embodiments. For example, in one or more embodiments, the gate electrodes 130, 132, 134 and/or one or more of the corresponding spacers 138, 140, 142, 144, 146, 148 are partially embedded in the isolation structure 106. In addition, in the example configuration in FIG. 6A, the gate end dielectric 150, 152 may adhere to opposite sidewalls of the gate electrode 132.

The semiconductor device 100 further comprises an inter-layer dielectric (ILD) layer over the isolation structure. In the example configuration in FIGS. 5A-6B, the semiconductor device 100 comprises an inter-layer dielectric (ILD) layer 116 over the isolation structure 106. Example materials of the ILD layer 116 include, but are not limited to, SiNx, SiOx, SiON, SiC, SiBN, SiCBN, or combinations thereof. The ILD layer 116 embeds therein the gate electrodes 130, 132, 134, and/or the corresponding spacers 138, 140, 142, 144, 146, 148. The ILD layer 116 further embeds therein the fins 112 and 114 of the first active area region 111 and the fins 122 and 124 of the second active area region 121 and contact plugs in the corresponding contact areas 154, 156, 158, 160. For the sake of simplicity, the contact plugs are designated by the same reference numerals of the corresponding contact areas.

In the example configuration in FIGS. 5A and 5B, two contact plugs 158, 160 are above the fin 124 and two contact plugs 154, 156 are above the fin 112. Example materials of the contact plugs 154, 156, 158, 160 include, but are not limited to, Ti, TiN, TaN, Co, Ru, Pt, W, Al, Cu, or combinations thereof. In some embodiments, at least one of the contact plugs 154, 156, 158, 160 includes multiple metal material. In some embodiments, the contact plugs 154, 156, 158, 160 are surrounded corresponding barrier layers. Example materials of the barrier layers include, Ti, TiN, or combinations thereof.

At least one of the contact plugs 154, 156, 158, 160 is electrically connected to the first interconnection layer of the layout 100A as depicted in FIG. 3. For example, the S/D via 174 between the contact plug 158 and the conductive line 186 is electrically coupled the contact plug 158 to the conductive line 186. The ILD layer 116 may embed therein the S/D via 174. In addition, in some embodiments, the semiconductor device 100 may further comprise an inter-metal dielectric (IMD) layer 190 above the ILD layer 116, and the IMD layer 190 may embed therein the conductive line 186. In the example configuration in FIGS. 5B and 6A, the gate via 166 is above the gate electrode 132 and between the gate electrode 132 and the conductive line 180 which is in the first interconnection layer of the layout 100A as depicted in FIG. 3. Example materials of the gate via 166 include, but are not limited to, Ti, TiN, TaN, Co, Ru, Pt, W, Al, Cu, or combinations thereof.

The semiconductor device 100 further comprises gate electrodes and gate dielectric layers. In the example configuration in FIGS. 5A-6B, the gate electrodes 130, 132, 134 wrap over the fins 112, 114, 122, 124 of the first and second active area regions 111, 121 in regions where the gate electrodes 130, 132, 134 cross over the fins 112, 114, 122, 124. To electrically isolate the gate electrodes 130, 132, 134 from the fins 112, 114, 122, 124, first gate dielectric layers 192, 194, 196 are arranged under and around the corresponding gate electrodes 130, 132, 134. The spacers 138, 140, 142, 144, 146, 148 are over opposite sides of the corresponding first gate dielectric layers 192, 194, 196. Example materials of the first gate dielectric layers 192, 194, 196 include, but are not limited to, a high-k dielectric layer, an interfacial layer, and/or combinations thereof. Example materials for the high-k dielectric layer include, but are not limited to, silicon nitride, silicon oxynitride, hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina (HfO2-Al2O3) alloy, suitable high-k dielectric materials, and/or combinations thereof. In at least one embodiment, a first gate dielectric layer includes multi-layer structure of, for example, $SiO_2$ with a high-k dielectric, or SiON with a high-k dielectric.

In some embodiments, the gate electrodes 130, 132, 134 include one or more conductive layers and/or materials. In the example configuration in FIG. 6A, the gate electrode 132 is wrapped over the fins 112, 114, 122, 124, and includes a first conductive gate material 132a over the p-well region 110 and a second conductive gate material 132b over the n-well region 120. In at least one embodiment, the conductive material or materials of at least one of the first and second conductive gate materials is/are selected in accordance with the type of device or transistor. For example, each of the first and second conductive gate materials 132a and 132b includes a conductive work function layer and a contact layer over the conductive work function layer.

In at least one embodiment, the work function layer is configured to have a work function in a range from 4 eV to 5 eV. In some embodiments, the first conductive gate material 132a includes an n-type work function metal (n-metal) for forming an NMOS over the p-well region 110. Example n-metals include, but are not limited to, Ta, TiAl, and TiAlN. In some embodiments, the second conductive gate material 132b includes a p-type work function metal (p-metal) for forming a PMOS over the n-well region 120. Example p-metals include, but are not limited to, TiN, TaN, a carbon-doped metal nitride such as TaCN. Other work function materials are within the scope of various embodiments. For example, in one or more embodiments, the work function layer comprises doped conducting oxide materials, TaAl, TiSi, NiSi, PtSi, suitable Ti containing work function materials, suitable Ta containing work function materials, suitable Al containing work function materials, and suitable W containing work function materials. In at least one embodiment, conductive work function layers in the first conductive gate material 132a and the second conductive gate material 132b include the same conductive material. In at least one embodiment, conductive work function layers in the first conductive gate material 132a and the second conductive gate material 132b include different conductive materials.

In at least one embodiment, the contact layer over the conductive work function layer is configured to have a low contact resistance. Example materials of the contact layer include, but are not limited to, polysilicon with silicide, refractory materials such as TiN, TaN, TiW, and TiAl, suitable Ti containing work function materials, suitable Ta containing work function materials, suitable Al containing work function materials, suitable W containing work function materials, suitable Cu containing work function materials, and suitable N containing work function materials.

The first conductive gate material 132a and the second conductive gate material 132b are isolated from the fins 112, 114, 122, 124 by the corresponding first gate dielectric layer 194. In some embodiments, the first gate dielectric layer 194 has a first portion over the n-well region 120 and a second portion over the p-well region 110. In at least one embodiment, the first and second portions of the first gate dielectric layer 194 include the same dielectric material. In at least one embodiment, the first and second portions of the first gate dielectric layer 194 include different dielectric materials. In the example configuration in FIG. 6, the gate electrode 132 extends continuously from the n-well region 120 into the p-well region 110, and the first conductive gate material 132a is in contact with the second conductive gate material 132b. Other arrangements are within the scope of various embodiments. For example, in at least one embodiment, at least one of the first and second portions of the first gate dielectric layer 194 is interposed between and electrically isolates the first conductive gate material 132a and the second conductive gate material 132b. In at least one embodiment, at least one of the first and second portions of the first gate dielectric layer 194 includes one or more of $HfO_2$, $Ta_2O_5$ and $Al_2O_3$.

In at least one embodiment, the work function layer, the contact layer and the gate dielectric layer configure a gate stack structure. Examples of gate stack structures include, but are not limited to, a metals/high-K dielectric structure, an Al/refractory metals/high-K dielectric structure, a W/refractory metals/high-K dielectric structure, a Cu/refractory metals/high-K dielectric structure, and a silicide/high-K dielectric structure. In at least one embodiment, the gate stack structure includes a $Si_3N_4$/metals/high-K dielectric structure in which the metals are selected from the group consisting of Al/refractory metals, W/refractory metals, Cu/refractory metals, silicide, and combinations thereof.

In the semiconductor device 100, the contact plugs are arranged in the spaces between adjacent spacers. In the example configuration in FIGS. 5A and 5B, the contact plugs 154, 158 are arranged in the space between adjacent spacers 140, 142. The contact plugs 156, 160 are arranged in the space between adjacent spacers 144, 146. In the example configuration in FIGS. 5A and 5B, top portion of the contact plugs 154, 156, 158, 160 are surrounded by a gate top dielectric layer 149. The material of the gate top dielectric layer 149 may be formed by a single layer or multiple layers stacked and selected from a group consist of $SiO_2$, SiOC, SiON, SiOCN, Carbon content oxide, Nitrogen content oxide, Carbon and Nitrogen content oxide, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), multiple metal content oxide, and a combination thereof. The gate top dielectric layer 149 also covers the gate electrodes 130, 132, 134. In some embodiments, the top surfaces of the contact plugs 154, 156, 158, 160 are flush with each other due to, e.g., a planarization process during manufacture. Other arrangements are within the scope of various embodiments.

In the semiconductor device 100, the contact plugs are in contact with corresponding source/drains. In the example configuration in FIGS. 5A and 5B, the fin 124 includes source/drains 126, 128 which are in contact with the corresponding contact plugs 158, 160; the fin 112 includes source/drains 127, 129 which are in contact with the corresponding contact plugs 154, 156. The source/drains 126, 127, 128, 129 are arranged between adjacent gate electrodes 130, 132, 134. In one or more embodiments, portions of the fin 124 or the fin 112 between the adjacent spacers are recessed to form S/D cavities having bottom surfaces lower than the top surface of the fin 124 or the fin 112. After the formation of the S/D cavities, the source/drains 126, 127, 128, 129 are produced by epi-growing a strained material in the S/D cavities. The depth of the source/drain 126, 127, 128, 129 is denoted as the first S/D depth D1, measured from a top surface of the fin to a bottom surface of the source/drain features. In some embodiments, the first S/D depth D1 is in a range from 40 nm to 60 nm. In at least one embodiment, the lattice constant of the strained material is different from the lattice constant of the substrate 104. Thus, channel regions of the semiconductor device are strained or stressed to enhance carrier mobility of the device. For example, for a PMOS device, the strained material is configured to apply a compressive stress to enhance hole mobility in the at least one source or drain region of the PMOS device. For an NMOS device, the strained material is configured to apply a tensile stress to enhance electron mobility in the at least one source or drain region of the NMOS device. Examples of the strained material include, but are not limited to, SiGe, SiGeC, SiC, GeSn, SiGeSn, SiP, SiCP and other suitable materials. In at least one embodiment, the strained material for a PMOS device comprises SiGe, SiGeC, Ge, Si, or a combination thereof. In a particular example, the source/drains 126, 128 of the PMOS device is SiGe doped with Boron (B). In at least one embodiment, the strained material for an NMOS device comprises SiC, SiP, SiCP, Si, or a combination thereof. In a particular example, the source/drains 127, 129 of the NMOS device is Si doped with Phosphorus (P) and/or Arsenic (As).

In some embodiments, at least one silicide region 300 may be formed on the source/drains 126, 127, 128, 129. In some embodiments, at least one metal layer is formed on the corresponding source/drains 126, 127, 128, 129, and then it may cause a reaction between the underlying silicon and the metal material of the metal layer to form the silicide regions 300. In some embodiments, the silicide regions 300 include a material selected from titanium silicide, cobalt silicide, nickel silicide, platinum silicide, erbium silicide, or palladium silicide. In some embodiments, the source/drains 126, 127, 128, 129 and the corresponding silicide regions 300 may collectively have a rising shape that protrudes above the fins. Accordingly, the silicide regions 300 may be in a position higher than a top surface of the fins. For example, the top surface of the fin 124 is in contact with the first gate dielectric layers 192, 194, 196 and an interface between the silicide regions 300 and the corresponding contact plugs 158, 160 is above the top surface of the fin 124.

In the example configuration in FIGS. 5A and 5B, the gate electrodes 130, 132, 134 may define the first gate length. For example, the gate electrode 130 crossing over the fin 124 or the fin 112 has the first gate length G1 along the longitudinal direction of the fin 124 or the fin 112. In some embodiments, the gate electrodes 130, 132, 134 can be arranged along the X-direction by the first pitch P1 which can be defined by a sum of the first width and the first spacing, as depicted in FIG. 3. For example, the gate electrodes 132 and 134 are arranged along the X-direction by the first pitch P1. In some embodiments, the first pitch P1 is in a range of 40 nm to 52 nm. In some embodiments, each of the contact plugs 154, 156, 158, 160 respectively corresponding to the contact areas 154, 156, 158, 160 shown in FIG. 3 has the first contact width C1 measured along the X-direction. The first contact width C1 may be referred to as a width of a top surface of at least one of the contact plugs 154, 156, 158, 160. In some embodiments, a length of an interface between the contact plug 158 and the S/D via 174 is substantially the same as the first contact width C1.

Figure 7A:
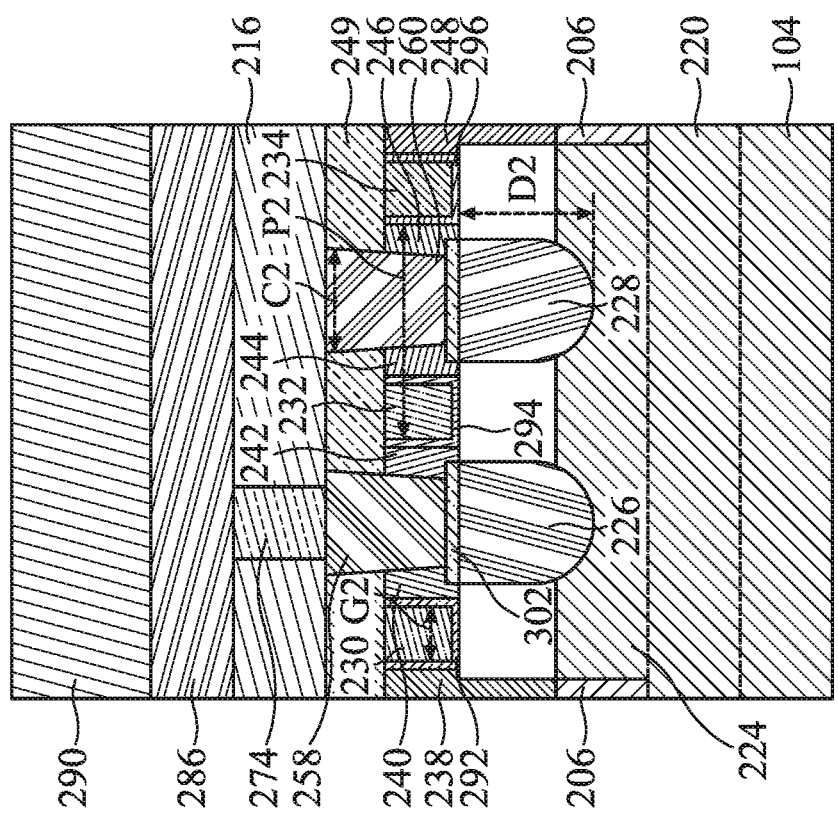
FIGS. 7A, 7B, 8A, and 8B are cross-section views of the semiconductor device having the layout of the second circuit.
Figure 7B:
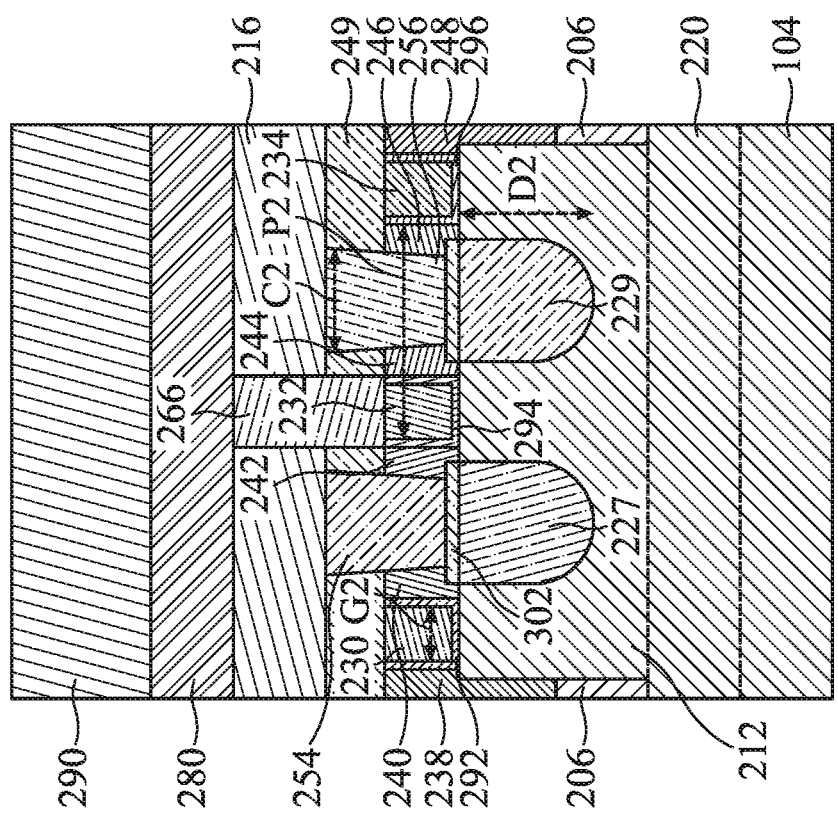
Figure 8A:
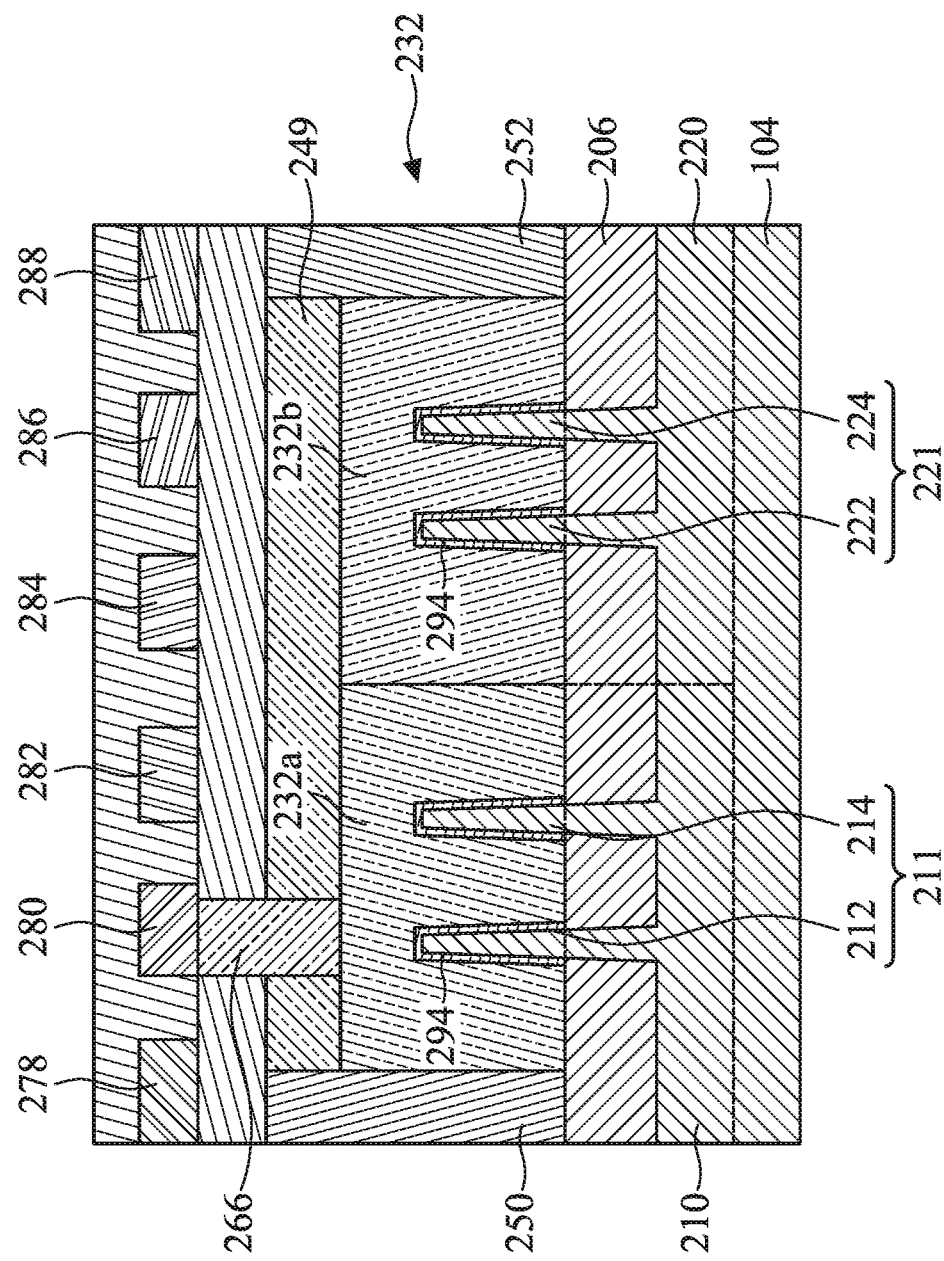
Figure 8B:
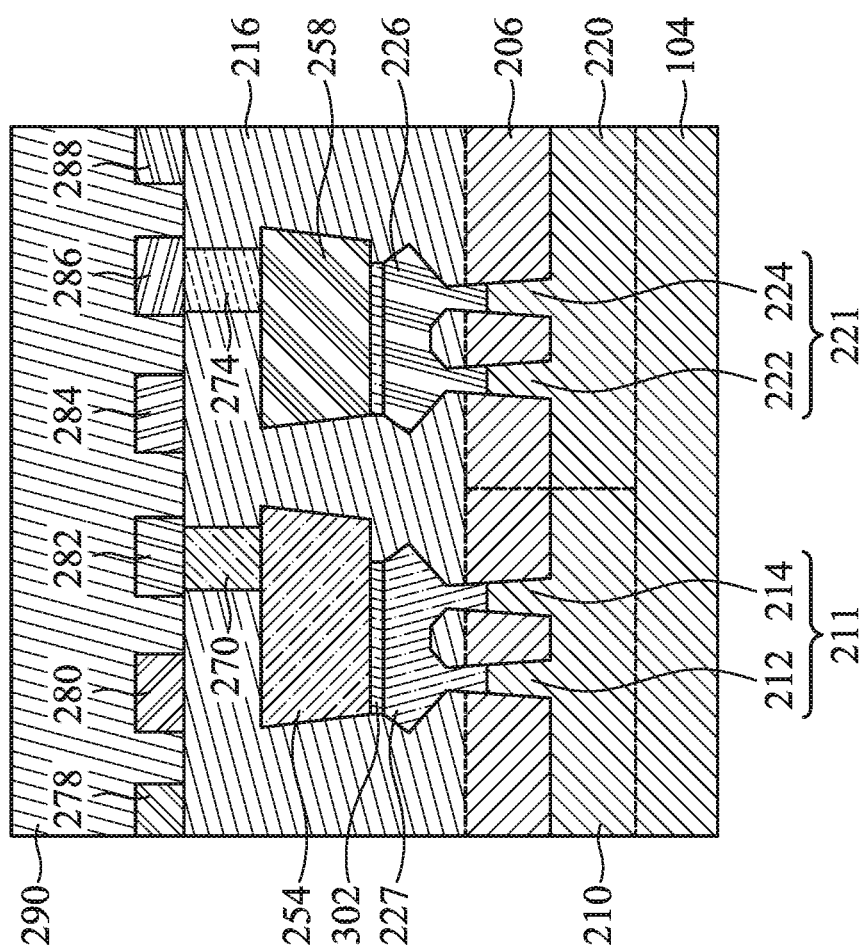

Reference is made to FIGS. 7A, 7B, 8A, and 8B. FIGS. 7A, 7B, 8A, and 8B are cross-section views of the semiconductor device 100 having the layout 100A. The cross-section view in FIG. 7A is taken along line 7A-7A in FIG. 4, which is a cut along a fin lengthwise direction in an n-well region 220. The cross-section view in FIG. 7B is taken along line 7B-7B in FIG. 4, which is a cut along a fin lengthwise direction in a p-well region 210. The cross-section view in FIG. 8A is taken along line 8A-8A in FIG. 4, which is a cut in a channel region across the well regions 210 and 220. The cross-section view in FIG. 8B is taken along line 8B-8B in FIG. 4, which is a cut in a source/drain region across the well regions 210 and 220. The configuration of the semiconductor device 100 is described herein with respect to both FIGS. 7A-8B. The structures shown in FIGS. 7A-8B can be formed by modelling in a layout as depicted in FIG. 4, and then physical elements or layers are formed by using the gate electrode and the gate contact as patterns.

As illustrated in FIGS. 7 and 8, various elements of the semiconductor device 100 are formed on the substrate 104. Many aspects of the substrate 104 are described in FIGS. 5 and 6, and thus the detailed explanation may be omitted.

The semiconductor device 100 further comprises one or more well regions over the substrate 104. In the example configuration in FIGS. 7A and 7B, the n-well region 220 is over the substrate 104, as described with respect to FIG. 4. In the example configuration in FIGS. 8A and 8B, the n-well region 220 and p-well region 210 are over the substrate 104, as described with respect to FIG. 4.

The semiconductor device 100 further comprises one or more isolation structures over and around the well regions 210, 220. In the example configuration in FIGS. 7 and 8, an isolation structure 206 is over the well regions 210, 220. The isolation structure 206 electrically isolates various elements of the semiconductor device 100 from each other. For example, as illustrated in FIG. 8, the isolation structure 206 electrically isolates the fins 212 and 214 in the third active area region 211 from the fins 222-224 in the fourth active area region 221. In the cross-section in FIG. 7, the isolation structure 224 has a thickness less than the fin 206. In at least one embodiment, the isolation structure 206 comprises one or more shallow trench isolation (STI) regions. Example materials of the STI regions include, but are not limited to, silicon oxide, silicon nitride, silicon oxynitride, fluoride-doped silicate, and/or any other low k dielectric materials. In some embodiments, the STI thickness is from 50 nm to 200 nm.

In the example configuration in FIGS. 7A-8B, the third and fourth active area regions 211, 221, gate electrodes 230, 232, 234, and corresponding spacers 238, 240, 242, 244, 246, 248, gate end dielectrics 250, 252 (best seen in FIG. 8A) are over the isolation structure 206. In the example configuration in FIGS. 7A-8B, the gate electrodes 230, 232, 234 and the corresponding spacers 238, 240, 242, 244, 246, 248 are over the isolation structure 206. Other arrangements are within the scope of various embodiments. For example, in one or more embodiments, the gate electrodes 230, 232, 234 and/or one or more of the corresponding spacers 238, 240, 242, 244, 246, 248 are partially embedded in the isolation structure 206. In addition, In the example configuration in FIG. 8A, the gate end dielectric 250, 252 may adhere to opposite sidewalls of the gate electrode 232. In some embodiments, the isolation structure 206 and the isolation structure 106 shown in either FIGS. 5A-B or FIGS. 6A-B have the same material. In some embodiments, the isolation structure 206 and the isolation structure 106 shown in either FIGS. 5A-B or FIGS. 6A-B have different materials.

The semiconductor device 100 further comprises an interlayer dielectric (ILD) layer over the isolation structure. In the example configuration in FIGS. 7A-8B, the semiconductor device 100 comprises an ILD layer 216 over the isolation structure 206. Example materials of the ILD layer 216 include, but are not limited to, SiNX, SiOx, SiON, SiC, SiBN, SiCBN, or combinations thereof. The ILD layer 216 embeds therein the gate electrodes 230, 232, 234, and/or the corresponding spacers 238, 240, 242, 244, 246, 248. The ILD layer 216 further embeds therein the fins 212 and 214 of the third active area region 211 and the fins 222 and 224 of the fourth active area region 221 and contact plugs in the corresponding contact areas 254, 256, 258, 260. For the sake of simplicity, the contact plugs are designated by the same reference numerals of the corresponding contact areas.

In the example configuration in FIGS. 7A and 7B, two contact plugs 258, 260 are above the fin 224 and two contact plugs 254, 256 are above the fin 212. Example materials of the contact plugs 254, 256, 258, 260 include, but are not limited to, Ti, TiN, TaN, Co, Ru, Pt, W, Al, Cu, or combinations thereof. In some embodiments, at least one of the contact plugs 254, 256, 258, 260 includes multiple metal material. In some embodiments, the contact plugs 254, 256, 258, 260 are surrounded corresponding barrier layers. Example materials of the barrier layers include, Ti, TiN, or combinations thereof.

At least one of the contact plugs 254, 256, 258, 260 is electrically connected to the first interconnection layer of the layout 100A as depicted in FIG. 4. For example, the S/D via 274 between the contact plug 258 and the conductive line 286 is electrically coupled the contact plug 258 to the conductive line 286. The ILD layer 216 may embed therein the S/D via 274. In addition, in some embodiments, the semiconductor device 100 may further comprise an IMD layer 290 above the ILD layer 216, and the IMD layer 290 may embed therein the conductive line 286. In the example configuration in FIGS. 7B and 8A, the gate via 266 is above the gate electrode 232 and between the gate electrode 232 and the conductive line 280 which is in the first interconnection layer of the layout 100A as depicted in FIG. 4. Example materials of the gate via 266 include, but are not limited to, Ti, TiN, TaN, Co, Ru, Pt, W, Al, Cu, or combinations thereof.

The semiconductor device 100 further comprises gate electrodes and gate dielectric layers. In the example configuration in FIGS. 7 and 8, the gate electrodes 230, 232, 234 wrap over the fins 212, 214, 222, 224 of the third and fourth active area regions 211, 221 in regions where the gate electrodes 230, 232, 234 cross over the fins 212, 214, 222, 224. To electrically isolate the gate electrodes 230, 232, 234 from the fins 212, 214, 222, 224, second gate dielectric layers 292, 294, 296 are arranged under and around the corresponding gate electrodes 230, 232, 234. The spacers 238, 240, 242, 244, 246, 248 are over opposite sides of the corresponding second gate dielectric layers 292, 294, 296. Example materials of the second gate dielectric layers 292, 294, 296 include, but are not limited to, a high-k dielectric layer, an interfacial layer, and/or combinations thereof. Example materials for the high-k dielectric layer include, but are not limited to, silicon nitride, silicon oxynitride, hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, suitable high-k dielectric materials, and/or combinations thereof. In at least one embodiment, a second gate dielectric layer includes multi-layer structure of, for example, $SiO_2$ with a high-k dielectric, or SiON with a high-k dielectric.

In some embodiments, the gate electrodes 230, 232, 234 include one or more conductive layers and/or materials. In the example configuration in FIG. 8A, the gate electrode 232 is wrapped over the fins 212, 214, 222, 224, and includes a third conductive gate material 232a over the p-well region 210 and a fourth conductive gate material 232b over the n-well region 220. In at least one embodiment, the conductive material or materials of at least one of the third and fourth conductive gate materials is/are selected in accordance with the type of device or transistor. For example, each of the third and fourth conductive gate materials 232a and 232b includes a conductive work function layer and a contact layer over the conductive work function layer.

In at least one embodiment, the work function layer is configured to have a work function in a range from 4 eV to 5 eV. In some embodiments, the third conductive gate material 232a includes an n-type work function metal (n-metal) for forming an NMOS over the p-well region 210. Example n-metals include, but are not limited to, Ta, TiAl, and TiAlN. In some embodiments, the second conductive gate material 232b includes a p-type work function metal (p-metal) for forming a PMOS over the n-well region 220. Example p-metals include, but are not limited to, TiN, TaN, a carbon-doped metal nitride such as TaCN. Other work function materials are within the scope of various embodiments. For example, in one or more embodiments, the work function layer comprises doped conducting oxide materials, TaAl, TiSi, NiSi, PtSi, suitable Ti containing work function materials, suitable Ta containing work function materials, suitable Al containing work function materials, and suitable W containing work function materials. In at least one embodiment, conductive work function layers in the third conductive gate material 232a and the fourth conductive gate material 232b include the same conductive material. In at least one embodiment, conductive work function layers in the third conductive gate material 232*a* and the fourth conductive gate material 232*b* include different conductive materials. Further, in at least one embodiment, conductive work function layers in the first conductive gate material 132*a* in the first circuit 102 and the third conductive gate material 232*a* in the second circuit 202 include the same conductive material. In at least one embodiment, conductive work function layers in the second conductive gate material 132*b* in the first circuit 102 and the fourth conductive gate material 232*b* in the second circuit 202 include the same conductive material. Alternatively, in at least one embodiment, conductive work function layers in the first conductive gate material 132*a* in the first circuit 102 and the third conductive gate material 232*a* in the second circuit 202 include different conductive materials. In at least one embodiment, conductive work function layers in the second conductive gate material 132*b* in the first circuit 102 and the fourth conductive gate material 232*b* in the second circuit 202 include different conductive materials.

In at least one embodiment, the contact layer over the conductive work function layer is configured to have a low contact resistance. Example materials of the contact layer include, but are not limited to, polysilicon with silicide, refractory materials such as TiN, TaN, TiW, and TiAl, suitable Ti containing work function materials, suitable Ta containing work function materials, suitable Al containing work function materials, suitable W containing work function materials, suitable Cu containing work function materials, and suitable N containing work function materials.

The third conductive gate material 232*a* and the fourth conductive gate material 232*b* are isolated from the fins 212, 214, 222, 224 by the corresponding second gate dielectric layer 294. In some embodiments, the second gate dielectric layer 294 has a first portion over the n-well region 220 and a second portion over the p-well region 210. In at least one embodiment, the first and second portions of the second gate dielectric layer 294 include the same dielectric material. In at least one embodiment, the first and second portions of the second gate dielectric layer 294 include different dielectric materials. In the example configuration in FIG. 8, the gate electrode 232 extends continuously from the n-well region 220 into the p-well region 210, and the third conductive gate material 232*a* is in contact with the fourth conductive gate material 232*b*. Other arrangements are within the scope of various embodiments. For example, in at least one embodiment, at least one of the first and second portions of the second gate dielectric layer 232 is interposed between and electrically isolates the third conductive gate material 232*a* and the fourth conductive gate material 232*b*. In at least one embodiment, at least one of the first and second portions of the second gate dielectric layer 294 includes one or more of $HfO_2$, $Ta_2O_5$ and $Al_2O_3$.

In at least one embodiment, the work function layer, the contact layer and the gate dielectric layer configure a gate stack structure. Examples of gate stack structures include, but are not limited to, a metals/high-K dielectric structure, an Al/refractory metals/high-K dielectric structure, a W/refractory metals/high-K dielectric structure, a Cu/refractory metals/high-K dielectric structure, and a silicide/high-K dielectric structure. In at least one embodiment, the gate stack structure includes a $Si_3N_4$/metals/high-K dielectric structure in which the metals are selected from the group consisting of Al/refractory metals, W/refractory metals, Cu/refractory metals, silicide, and combinations thereof.

In the semiconductor device 100, the contact plugs are arranged in the spaces between adjacent spacers. In the example configuration in FIGS. 7A and 7B, the contact plugs 254, 258 are arranged in the space between adjacent spacers 240, 242. The contact plugs 256, 260 are arranged in the space between adjacent spacers 244, 246. In the example configuration in FIG. 7, top portion of the contact plugs 254, 256, 258, 260 are surrounded by a gate top dielectric layer 249. The material of the gate top dielectric layer 249 may be formed by a single layer or multiple layers stacked and selected from a group consist of $SiO_2$, SiOC, SiON, SiOCN, Carbon content oxide, Nitrogen content oxide, Carbon and Nitrogen content oxide, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), multiple metal content oxide, and a combination thereof. In some embodiments, the top surfaces of the contact plugs 254, 256, 258, 260 are flush with each other due to, e.g., a planarization process during manufacture. Other arrangements are within the scope of various embodiments.

In the semiconductor device 100, the contact plugs are in contact with corresponding source/drains. In the example configuration in FIG. 7, the fin 224 includes source/drains 226, 228 which are in contact with the corresponding contact plugs 258, 260; the fin 212 includes source/drains 227, 229 which are in contact with the corresponding contact plugs 254, 256. The source/drains 226, 227, 228, 229 are arranged between adjacent gate electrodes 230, 232, 234. In one or more embodiments, portions of the fin 224 or the fin 212 between the adjacent spacers are recessed to form S/D cavities having bottom surfaces lower than the top surface of the fin 224 or the fin 212. After the formation of the S/D cavities, the source/drains 226, 227, 228, 229 are produced by epi-growing a strained material in the S/D cavities. The depth of the source/drains 226, 227, 228, 229 is denoted as the second S/D depth D2, measured from a top surface of the fin to a bottom surface of the source/drain features. In some embodiments, the second S/D depth D2 is in a range from 45 nm to 70 nm. In at least one embodiment, the lattice constant of the strained material is different from the lattice constant of the substrate 104. Thus, channel regions of the semiconductor device are strained or stressed to enhance carrier mobility of the device. For example, for a PMOS device, the strained material is configured to apply a compressive stress to enhance hole mobility in the at least one source or drain region of the PMOS device. For an NMOS device, the strained material is configured to apply a tensile stress to enhance electron mobility in the at least one source or drain region of the NMOS device. Examples of the strained material include, but are not limited to, SiGe, SiGeC, SiC, GeSn, SiGeSn, SiP, SiCP and other suitable materials. In at least one embodiment, the strained material for a PMOS device comprises SiGe, SiGeC, Ge, Si, or a combination thereof. In a particular example, the source/drains 226, 228 of the PMOS device is SiGe doped with Boron. In at least one embodiment, the strained material for an NMOS device comprises SiC, SiP, SiCP, Si, or a combination thereof. In a particular example, the source/drains 227, 229 of the NMOS device is Si doped with Phosphorus (P) and/or Arsenic (As).

In some embodiments, at least one silicide region 302 may be formed on the source/drains 226, 227, 228, 229. In some embodiments, at least one metal layer is formed on the corresponding source/drains 226, 227, 228, 229, and then it may cause a reaction between the underlying silicon and the metal material of the metal layer to form the silicide regions 302. In some embodiments, the silicide regions 302 include a material selected from titanium silicide, cobalt silicide, nickel silicide, platinum silicide, erbium silicide, or palladium silicide. In some embodiments, the source/drains 226, 227, 228, 229 and the corresponding silicide regions 302 may collectively have a rising shape that protrudes above the fins. Accordingly, the silicide regions 302 may be in a position higher than a top surface of the fins. For example, the top surface of the fin 224 is in contact with the second gate dielectric layers 292, 294, 296 and an interface between the silicide regions 302 and the corresponding contact plugs 258, 260 is above the top surface of the fin 224.

In the example configuration in FIGS. 7A and 7B, the gate electrodes 230, 232, 234 may define the second gate length. For example, the gate electrode 230 crossing over the fin 224 or the fin 212 has the second gate length G2 along the longitudinal direction of the fin 224 or the fin 212. In some embodiments, the gate electrodes 230, 232, 234 can be arranged along the X-direction by the second pitch P2 which can be defined by a sum of the second width and the second spacing, as depicted in FIG. 4. For example, the gate electrodes 232 and 234 are arranged along the X-direction by the second pitch P2. In some embodiments, the second pitch P2 is in a range of 45 nm to 58 nm. In some embodiments, each of the contact plugs 254, 256, 258, 260 respectively corresponding to the contact areas 254, 256, 258, 260 shown in FIG. 4 has the second contact width C2 measured along the X-direction. The second contact width C2 may be referred to as a width of a top surface of at least one of the contact plugs 254, 256, 258, 260. In some embodiments, a length of an interface between the contact plug 258 and the S/D via 274 is less than the second contact width C2.

Reference is made to FIGS. 5A-B and 7A-B. The first gate dielectric layers 192, 194, 196 may have a first thickness, the first thickness can be referred to as a distance between the fins 122, 124 and the gate electrodes 130, 132, 134. For example, a portion of the first gate dielectric layer 192 is between the fin 124 and the gate electrode 130 and has the first thickness. The second gate dielectric layers 292, 294, 296 may have a second thickness, the second thickness can be referred to as a distance between the fins 222, 224 and the gate electrodes 230, 232, 234. For example, a portion of the second gate dielectric layer 292 is between the fin 224 and the gate electrode 230 and has the second thickness. In some embodiments, the first thickness is substantially the same as the second thickness, and the first gate dielectric layers 192, 194, 196 may have materials the same as those of the second gate dielectric layers 292, 294, 296.

Reference is made to FIGS. 3 and 4. The S/D vias 170, 172, 174, 176 may have a first contact area. For example, the S/D via 174 may have a top surface facing away from the fin 124, and the top surface of the S/D via 174 has the first contact area. The S/D vias 270, 272, 274, 276 may have a second contact area. For example, the S/D via 274 may have a top surface facing away from the fin 224, and the top surface of the S/D via 274 has the second contact area. In some embodiments, the second contact area is greater than the first contact area. In some embodiments, a ratio of the second contact area to the first contact area is greater than 1.1. In some embodiments, a ratio of the second contact area to the first contact area is in a range from 1.1 to 2. Such ratio may be advantageous to avoid yield loss. For example, a planarization process, such as a CMP process can be performed smoothly.

In some embodiments, the first gate length G1 may be substantially the same as the second gate length G2 (i.e., G1=G2). In some embodiments, the second spacing S2 is greater than the first spacing S1. In some embodiments, the second pitch P2 is greater than the first pitch P1. In some embodiments, a ratio of the second pitch P2 to the first pitch P1 is greater than 1.05. If the ratio is not greater than 1.05, the second pitch P2 may not be wide enough to support needs of performance circuit application. In some embodiments, a ratio of the second pitch P2 to the first pitch P1 is in a range from 1.05 to 1.2. If the ratio is larger than 1.2, the second pitch P2 may become unnecessary large so that circuit density becomes low and manufacturing cost is accordingly increased. In some embodiments, the second contact width C2 is greater than the first contact width C1. In some embodiments, a ratio of the second contact width C2 to the first contact width C1 is greater than 1.2. If the ratio is not greater than 1.2, the resistance of the second contact may not be small enough to support stronger current of performance circuits. In some embodiments, a ratio of the second contact width C2 to the first contact width C1 is in a range from 1.2 to 2. If the ratio is larger than 2, the circuit area may have to be enlarged to accommodate a large contact so that circuit density becomes low and manufacturing cost is accordingly increased. In some embodiments, the fin 112, 114, 122, 124 in the first and second active area regions 111, 121 and the fins 212, 214, 222, 224 in the third and fourth active area regions 211, 221 have the same width measured along the Y-direction. The ratios stated above may also be advantageous to avoid yield loss. For example, a planarization process, such as a CMP process can be performed smoothly.

Such dimension differences may be advantageous to provide various applications or functions for different circuits. For example, the second circuit 202 can be used in speed-driven logic circuits. For example, due to a relatively larger pitch in the second circuit 202 than in the first circuit 102 (P2>P1), during recessing respective fins to form S/D cavities, relatively more etchant reaches the fin top surfaces in the active area regions 211, 221 than in the active area regions 111, 121. Consequently, the S/D cavities in the second circuit 202 are etched deeper than the S/D cavities in the first circuit 102. In another word, the second S/D depth D2 in the second circuit 202 is greater than the first S/D depth D1 in the first circuit 102. In various embodiments, the S/D cavities etching process may be tuned (with the help of the pitches P1 and P2 and the contact widths C1 and C2) to produce the second S/D depth D2 greater than the first S/D depth D1 by at least 3 nm, such as from 3 nm to 15 nm. As seen in the illustrated embodiment in FIGS. 6B and 8B as a particular example, the bottom surfaces of the source/drains 126, 127 are flush with a top surface of the isolation structure 106, while the bottom surfaces of the source/drains 226, 227 are below a top surface of the isolation structure 206. The larger second S/D depth D2 also leads a larger source/drain volume in the second circuit 202 than in the first circuit 102, which provides a higher strain to channels (e.g., SiGe channel) of the PMOS device in the second circuit 202 than in the first circuit 102. The higher strain to channels of the PMOS device in the second circuit 202 in turn provides stronger gate control (e.g., a ratio of on-state current and off-state current ($I_{on}/I_{off}$) larger than 10% of gain). Accordingly, the second circuit 202 is able to be used in high speed application. If the S/D depth difference is less than 3 nm, then the source/drain volume may be not big enough to support needs of performance circuit application. If the S/D depth difference is larger than 15 nm, over etching may harm semiconductor substrate thereunder. Further, since the S/D vias of the second circuit 202 have the second contact area greater than the first contact area of the S/D vias of the first circuit 102, resistance reduction of the second circuit 202 is achieved. As such, the second circuit 202 can be used in speed-driven logic circuits. On the other hand, the dimension differences may achieve high circuit density of the first circuit 102. As such, with respect to the application of the semiconductor device 100, either high speed or high circuit density is achieved. The S/D depth difference stated above from 3 nm to 15 nm provides a good compromise between circuit performance and manufacturing cost.

Figure 9:
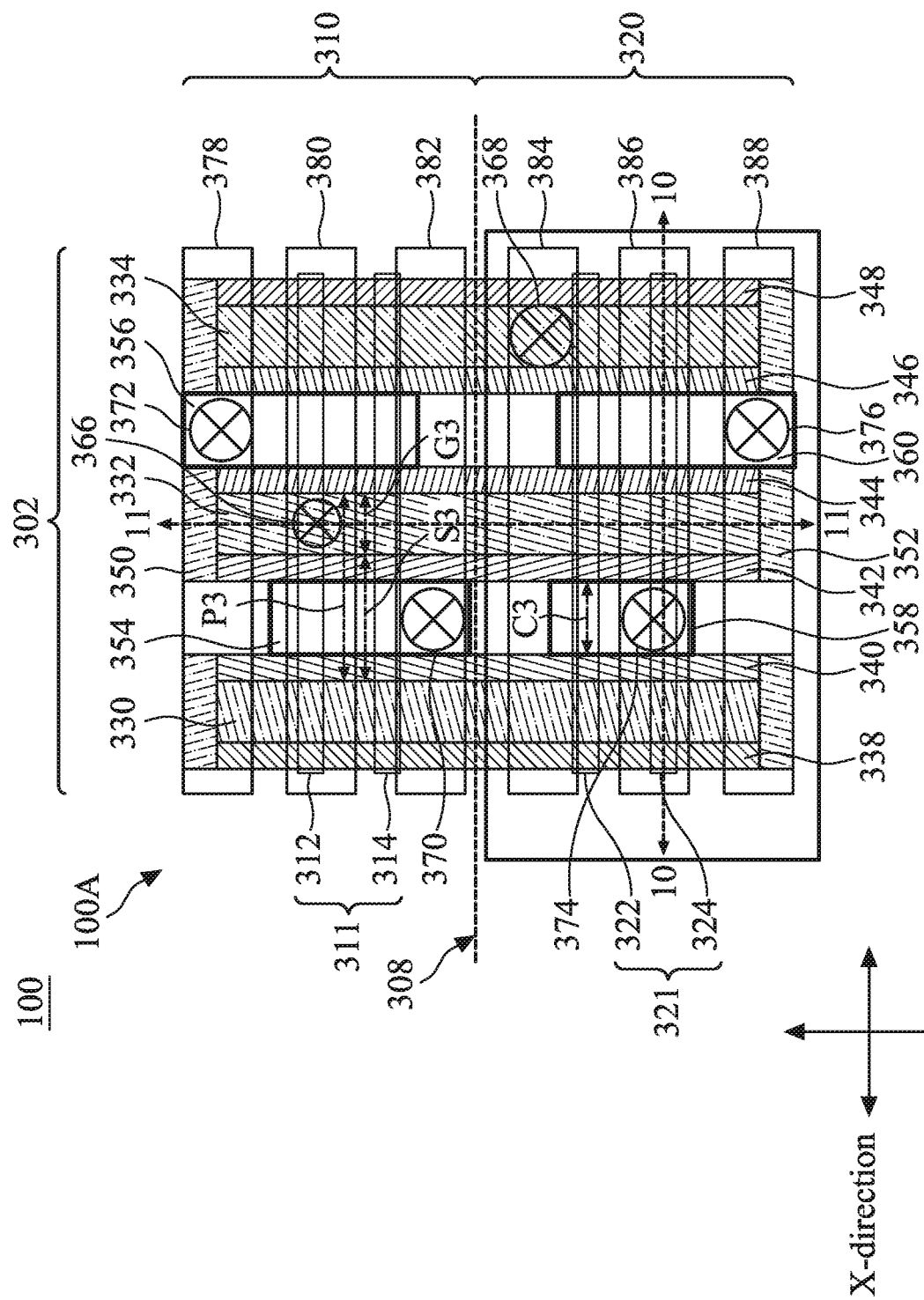
FIG. 9 illustrates a top view of a layout of a third circuit of the semiconductor device.

Reference is made to FIG. 9. FIG. 9 illustrates a top view of a layout of a third circuit 302 of the semiconductor device 100. Illustrations in FIGS. 3, 4, and 9 can collectively serve as a top view of a layout 100A corresponding to the semiconductor device 100 according to some embodiments of the present disclosure. The semiconductor device 100 may include a third circuit 302, besides the first circuit 102 and the second circuit 202. The first circuit 102, the second circuit 202, and the third circuit 302 are spaced from each other by a region which includes, for example, an isolation structure. In some embodiments, the first circuit 102 may serve as a partial layout of a first device of the semiconductor device 100, the second circuit 202 may serve as a partial layout of a second device of the semiconductor device 100, and the third circuit 302 may serve as a layout of a third device of the semiconductor device 100. As will be discussed in further details below, with respect to the first circuit 102 suitable for a high-density memory region and the second circuit 202 suitable for a high-speed circuit region, the third circuit 302 can meet lower leakage requirements and suitable for a static random access memory (SRAM) circuit, such as a pull-up device in an SRAM cell.

The third circuit 302 includes a fifth active area region 311 with fins 312 and 314, a sixth active area region 321 with fins 322 and 324, a plurality of gate electrodes 330, 332, and 334, a plurality of spacers 338, 340, 342, 344, 346, and 348, a plurality of contact areas 354, 356, 358, and 360, a plurality of gate vias 366 and 368, a plurality of source/drain (S/D) vias 370, 372, 374, and 376, and a plurality of conductive lines 378, 380, 382, 384, 386, and 388.

The fifth and sixth active area regions 311 and 321 extend along a X-direction of the layout 100A. The X-direction of the layout 100A can be referred to as the X-direction of FIG. 1. In some embodiments, the fifth and sixth active area regions 311 and 321 are also referred to as oxide-definition (OD) regions. Example materials of the fifth and sixth active area regions 311 and 321 include, but are not limited to, semiconductor materials doped with various types of p-dopants and/or n-dopants. In some embodiments, the fifth and sixth active area regions 311 and 321 include dopants of the same type. In some embodiments, one of the fifth and sixth active area regions 311 and 321 includes dopants of a type different from a type of dopants of another one of the fifth and sixth active area regions 311 and 321. The fifth and sixth active area regions 311 and 321 are isolated from each other by one or more isolation structures as described herein. The fifth and sixth active area regions 311 and 321 are within corresponding well regions. For example, the fifth active area region 311 is within a well region 310 which is a p-well region in one or more embodiments, and the sixth active area region 321 is within a well region 320 which is an n-well region in one or more embodiments. The described conductivity of the well regions 310 and 320 is an example. Other arrangements are within the scope of various embodiments.

The p-well region 310 and the n-well region 320 are on opposite sides of an imaginary line 308 which divides the semiconductor device into separate regions for different types of devices or transistors. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, multi-bridge-channel (MBC) transistors such as surrounding gate transistors (SGT) or gate-all-around (GAA) transistors, or the like. In the example configuration in FIG. 9, the p-well region 310 is a region for forming n-channel metal-oxide semiconductor (NMOS) transistors, and the n-well region 320 is a region for forming p-channel metal-oxide semiconductor (PMOS) transistors. Each of the fifth and sixth active area regions 311 and 321 includes one or more fins to form FinFETs as described in FIGS. 1 and 2. For example, the fifth active area region 311 comprises the two fins 312, 314 and the sixth active area region 321 comprises the two fins 322, 324. The fins 312, 314, 322, 324 are isolated from each other by one or more isolation structures as described herein. Other numbers of fins in each of the fifth and sixth active area regions 311 and 321 are within the scope of various embodiments. The described FinFET configuration is an example. Other arrangements are within the scope of various embodiments. For example, in one or more embodiments, the fifth and sixth active area regions 311 and 321 do not include fins and are configured for forming planar MOSFET transistors. For another example, in one or more embodiments, the fifth and sixth active area regions 311 and 321 include vertically stacked channel members, such as nanowires or nanosheets, and are configured for forming MBC transistors.

The fins 312, 314, 322, 324 are extend in an elongated manner in the X-direction. In some embodiments, the fins 312, 314 are parts of the NMOSFET, and the fins 322, 324 are parts of the PMOSFET. The NMOSFET fins 312, 314 are located over the p-well region 310, whereas the PMOSFET fins 322, 324 are located over the n-well region 320. In some embodiments, unlike the PMOSFET fins 122, 124 in the first circuit 102 and the PMOSFET fins 222, 224 in the second circuit 202 that may include silicon germanium (SiGe) material in channels for strain effect enhancement, the PMOSFET fins 322, 324 in the third circuit 302 may comprise a non-germanium-containing semiconductor material, for example Si (e.g., without recessing fins and epitaxial growing SiGe from recessed fins in channel regions after fin formation). By having a channel of Si, the strain to channels of the PMOSFET in the third circuit 302 is less, which in turn leads to a higher threshold voltage (Vt) and accordingly a lower leakage performance. As such, the third circuit 302 can meet lower leakage requirements. The NMOSFET fins 312, 314 may comprise Si. In some embodiment, at least one of the fins 312, 314 of the fifth active area region 311 and the fins 322, 324 of the sixth active area region 321 has a width measured along the Y-direction as described with respect to the fin width $W_{fin}$ in FIG. 1.

The gate electrodes 330, 332, 334 extend along an Y-direction of the layout 100A. The Y-direction of the layout 100A can be referred to as the Y-direction of FIG. 1. The gate electrodes 330, 332, 334 are across fifth and sixth active area regions 311 and 321. Example materials of the gate electrodes 330, 332, 334 include, but are not limited to, poly-silicon and metal. Other materials are within the scope of various embodiments. The gate electrodes 330, 332, 334 and the corresponding fifth and sixth active area regions 311 and 321 form one or more transistors in the third circuit 302. In the example configuration in FIG. 9, a transistor may be formed by the gate electrode 332 and the fifth active area region 311, and such transistor may include a gate, a drain and a source. The gate of the transistor is formed by the gate electrode 332. One of the drain or the source of the transistor is defined by a region of the fifth active area region 311 on one side (e.g., the right side in FIG. 9) of the gate electrode 332. The other source/drain of the transistor is defined by another region of the fifth active area region 311 on the opposite side (e.g., the left side in FIG. 9) of the gate electrode 332. For another example, a further transistor may be formed by the gate electrode 332 and the sixth active area region 321. In at least one embodiment, such further transistors are formed by the gate electrode 330 and the corresponding fifth and sixth active area regions 311 and 321. One or more of the gate electrodes 330, 332, 334 are coupled to other circuitry of the semiconductor device 100 by corresponding gate vias. For example, the gate vias 366, 368 may be respectively formed on the gate electrodes 332, 334 and configured to electrically couple to the gate electrodes 332, 334 to other circuitry. In some embodiments, the gate vias 366, 368 overlap the corresponding gate electrodes 332, 334 and respectively have vertical projections projected on the corresponding gate electrodes 332, 334. The gate vias 366, 368 may be in a circle shape.

In some embodiment, at least one of the gate electrodes 330, 332, 334 has a third width measured along the X-direction as described with respect to the length $L_G$ of the gate 60 in FIG. 1. The third width of at least one of the gate electrodes 330, 332, 334 may define a third gate length. For example, the gate electrode 332 crossing over the fin 312 has a third gate length G3 along a longitudinal direction of at least one of the fins 312, 314, 322, 324 (i.e., the X-direction of the layout 100A). In some embodiments, a pair of the adjacent gate electrodes 330, 332, 334 are spaced from each other by a third spacing measured along the X-direction. For example, the adjacent gate electrodes 330, 332 are spaced from each other by the third spacing S3. The third spacing S3 can be referred to as a distance that is measured along the X-direction and between boundaries of the adjacent gate electrodes 330, 332. For example, one side (e.g., the right side in FIG. 9) of the boundary of the gate electrode 330 and the opposite side (e.g., the left side in FIG. 9) of the boundary of the gate electrode 332 are spaced from each other by the third spacing S3. In some embodiments, the gate electrodes 330, 332, 334 can be arranged along the X-direction by a third pitch P3, which can be defined by a sum of the third width and the third spacing. For example, the third pitch P3 is equal to a sum of the third width G3 and the third spacing S3, and thus the third pitch P3 is equal to a distance measured along the X-direction from one side (e.g., the right side in FIG. 9) of the boundary of the gate electrode 330 and the same side (e.g., the right side in FIG. 9) of the boundary of the gate electrode 332.

The spacers 338, 340, 342, 344, 346, 348 are arranged along sides of the corresponding gate electrodes 330, 332, 334. For example, the spacers 342 and 344 are arranged along longitudinal sides of the gate electrode 332 in the X-direction, and the spacers 346 and 348 are arranged along longitudinal sides of the gate electrode 334 in the X-direction. The spacers 338, 340, 342, 344, 346, 348 include one or more dielectric materials for electrically isolating the corresponding gate electrodes from unintended electrical contact. Example dielectric materials of the spacers include, but are not limited to, silicon nitride, oxynitride and silicon carbide. In at least one embodiment, one or more of the spacers 338, 340, 342, 344, 346, 348 have a tapered profile as described herein.

The contact areas 354, 356, 358, 360 overlap the corresponding fifth and sixth active area regions 311 and 321. For example, the contact areas 354, 356 overlap the fifth active area region 311, and the contact areas 358, 360 overlap the sixth active area region 321. The contact areas 354, 356, 358, 360 are configured to electrically couple the underlying source/drains of the corresponding transistors with each other or with other circuitry of the semiconductor device 100. In some embodiments, a plurality of contact plugs are disposed within the corresponding contact areas 354, 356, 358, 360. In the example configuration in FIG. 9, boundaries of one or more of the contact areas 354, 356, 358, 360 are spaced from boundaries of the spacers 338, 340, 342, 344, 346, 348. For example, a left edge of the contact area 356 is spaced in the X-direction from an adjacent right edge of the spacer 344, and a right edge of the contact area 356 is spaced in the X-direction from an adjacent left edge of the spacer 346. Other arrangements are within the scope of various embodiments. For example, in one or more embodiments, one or more of the contact areas are self-aligned contacts (SAC) having boundaries defined at least partially by boundaries of the spacers 338, 340, 342, 344, 346, 348. In some embodiments, the contact areas 354, 356, 358, 360 are rectangular. For example, at least one of the contact areas 354, 356, 358, 360 has a slot shape having a pair of longer sides and a pair of shorter sides, in which a ratio of a length of the longer sides to a length of the shorter sides is in a range from 2 to 30. Such ratio may be advantageous to avoid yield loss. For example, a planarization process, such as a chemical mechanical polishing (CMP) process can be performed smoothly. In some embodiment, at least one of the contact areas 354, 356, 358, 360 has a third contact width measured along the X-direction. For example, each of the contact areas 354, 356, 358, 360 has the third contact width C3 measured along the X-direction.

The S/D vias 370, 372, 374, 376 respectively overlap with the contact areas 354, 356, 358, 360 and respectively have vertical projections projected on the contact areas 354, 356, 358, 360. The S/D vias 370, 372, 374, 376 are in a circle shape. In the layout 100A, at least one of the S/D vias 370, 372, 374, 376 is circular and has a third circular area. The S/D vias 370, 372, 374, 376 can be configured to electrically couple to the contact areas 354, 356, 358, 360 to other circuitry.

The conductive lines 378, 380, 382, 384, 386, 388 extend along the X-direction of the layout 100A. In some embodiments, the conductive lines 378, 380, 382, 384, 386, 388 are in a first interconnection layer of the layout 100A, such as the first metal layer (M1). The conductive lines 378, 380, 382, 384, 386, 388 overlap and are electrically connected to corresponding elements. For example, the conductive line 380 overlaps with the gate electrode 332, and the conductive line 382 overlaps with the contact area 354. In some embodiments, the conductive line 380 is electrically connected to the gate electrode 332 through the gate via 366. In some embodiments, the conductive line 382 is electrically connected to the contact area 354 through the S/D via 370.

Figure 10:
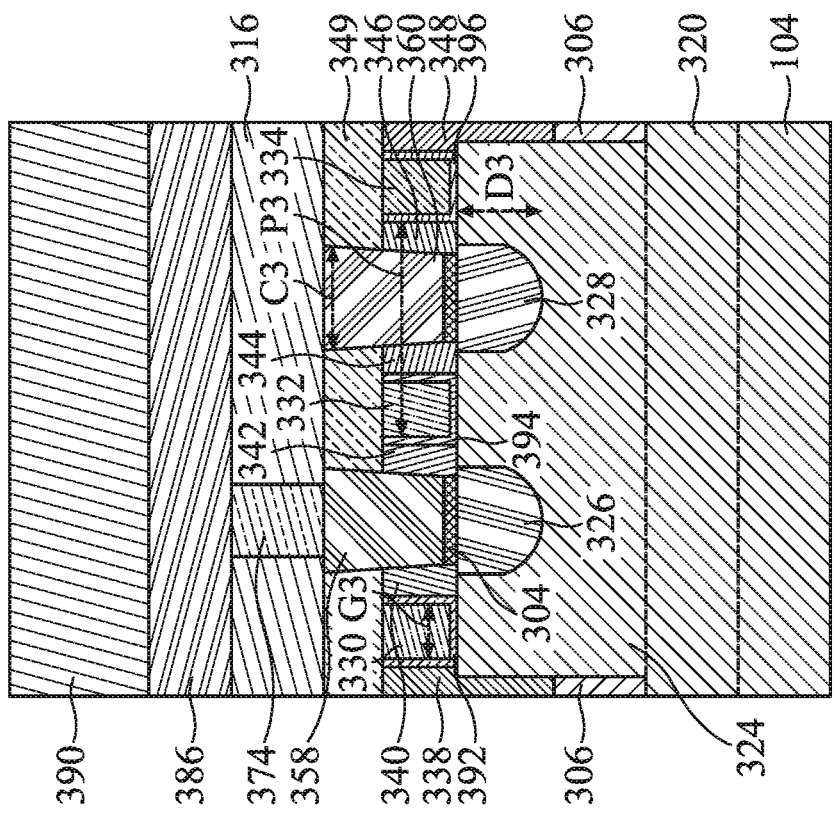
FIGS. 10 and 11 are cross-section views of the semiconductor device having the layout of the third circuit.
Figure 11:
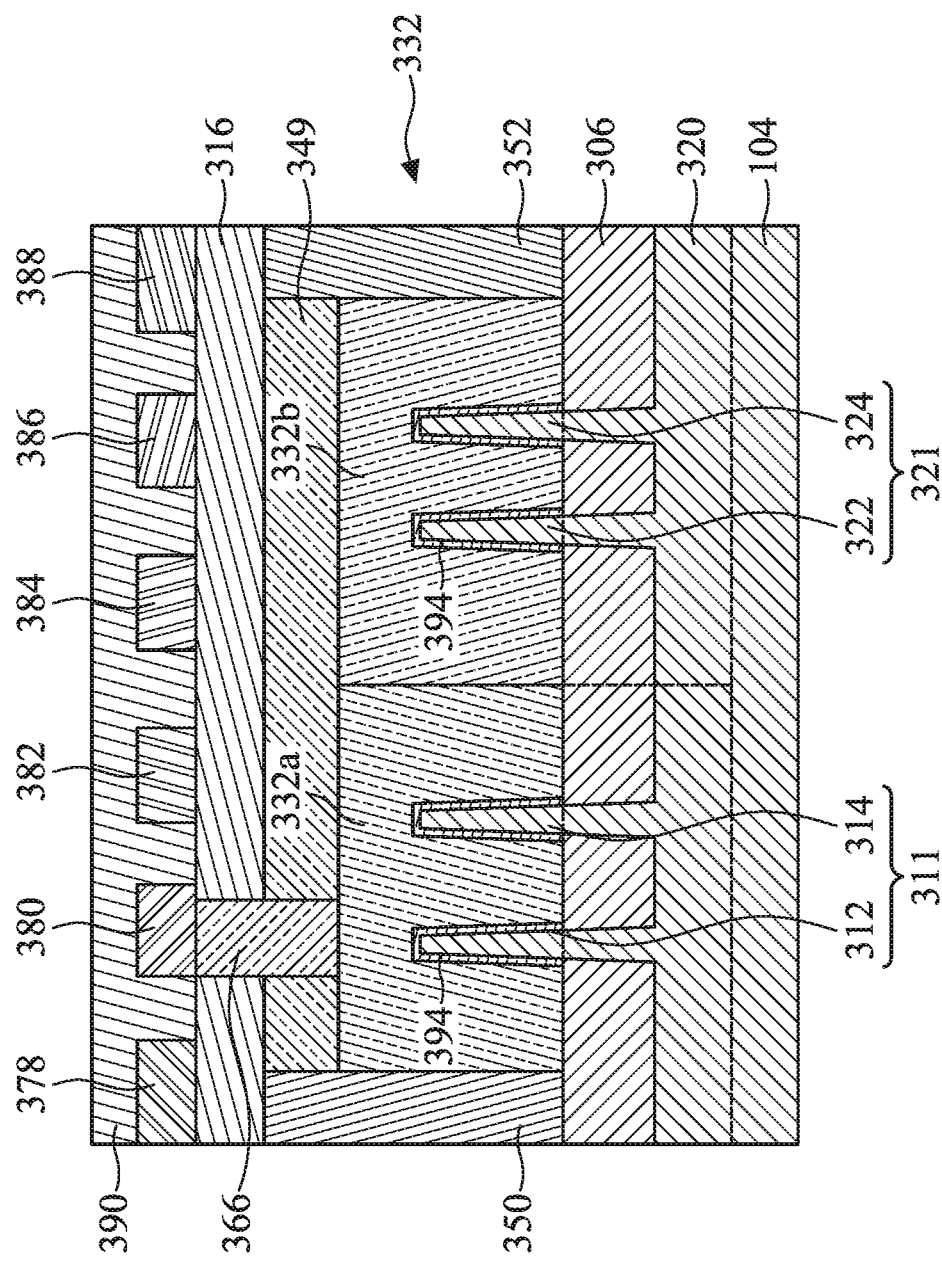

Reference is made to FIGS. 10 and 11. FIGS. 10 and 11 are cross-section views of the semiconductor device 100 having the layout 100A. The cross-section view in FIG. 10 is taken along line 10-10 in FIG. 9. The cross-section view in FIG. 11 is taken along line 11-11 in FIG. 9. The configuration of the semiconductor device 100 is described herein with respect to both FIG. 10 and FIG. 11. The structures shown in FIGS. 10 and 11 can be formed by modelling in a layout as depicted in FIG. 9, and then physical elements or layers are formed by using the gate electrode and the gate contact as patterns.

As illustrated in FIGS. 10 and 11, various elements of the semiconductor device 100 are formed on the substrate 104.

Many aspects of the substrate 104 are described in FIGS. 5 and 6, and thus the detailed explanation may be omitted.

The semiconductor device 100 further comprises one or more well regions over the substrate 104. In the example configuration in FIG. 10, the n-well region 320 is over the substrate 104, as described with respect to FIG. 9. In the example configuration in FIG. 11, the n-well region 320 and p-well region 310 are over the substrate 104, as described with respect to FIG. 9.

The semiconductor device 100 further comprises one or more isolation structures over and around the well regions 310, 320. In the example configuration in FIGS. 10 and 11, an isolation structure 306 is over the well regions 310, 320. The isolation structure 306 electrically isolates various elements of the semiconductor device 100 from each other. For example, as illustrated in FIG. 11, the isolation structure 306 electrically isolates the fins 312 and 314 in the fifth active area region 311 from the fins 322 and 324 in the sixth active area region 321. In the cross-section in FIG. 10, the isolation structure 306 has a thickness less than the fin 324. In at least one embodiment, the isolation structure 306 comprises one or more shallow trench isolation (STI) regions. Example materials of the STI regions include, but are not limited to, silicon oxide, silicon nitride, silicon oxynitride, fluoride-doped silicate, and/or any other low k dielectric materials. In some embodiments, the STI thickness is from 50 nm to 200 nm.

The semiconductor device 100 further comprises active area regions, gate electrodes, and corresponding spacers over the isolation structure. In the example configuration in FIGS. 10 and 11, the fifth and six active area regions 311, 321, gate electrodes 330, 332, 334, and corresponding spacers 338, 340, 342, 344, 346, 348, gate end dielectric 350, 352 (best seen in FIG. 11) over the isolation structure 306. In the example configuration in FIGS. 10 and 11, the gate electrodes 330, 332, 334, and the corresponding spacers 338, 340, 342, 344, 346, 348 are over the isolation structure 306. Other arrangements are within the scope of various embodiments. For example, in one or more embodiments, the gate electrodes 330, 332, 334 and/or one or more of the corresponding spacers 338, 340, 342, 344, 346, 348 are partially embedded in the isolation structure 306. In addition, in the example configuration in FIG. 11, the gate end dielectric 350, 352 may adhere to opposite sidewalls of the gate electrode 332.

The semiconductor device 100 further comprises an inter-layer dielectric (ILD) layer over the isolation structure. In the example configuration in FIGS. 10 and 11, the semiconductor device 100 comprises an inter-layer dielectric (ILD) layer 316 over the isolation structure 306. Example materials of the ILD layer 316 include, but are not limited to, SiNx, SiOx, SiON, SiC, SiBN, SiCBN, or combinations thereof. The ILD layer 316 embeds therein the gate electrodes 330, 332, 334, and/or the corresponding spacers 338, 340, 342, 344, 346, 348. The ILD layer 316 further embeds therein the fins 312 and 314 of the fifth active area region 311 and the fins 322 and 324 of the sixth active area region 321 and contact plugs in the corresponding contact areas 358 and 360. For the sake of simplicity, the contact plugs are designated by the same reference numerals of the corresponding contact areas.

In the example configuration in FIG. 10, two contact plugs 358, 360 are above the fin 324. Example materials of the contact plugs 358, 360 include, but are not limited to, Ti, TiN, TaN, Co, Ru, Pt, W, Al, Cu, or combinations thereof. In some embodiments, at least one of the contact plugs 358, 360 includes multiple metal material. In some embodiments, the contact plugs 358, 360 are surrounded corresponding barrier layers. Example materials of the barrier layers include, Ti, TiN, or combinations thereof.

At least one of the contact plugs 358, 360 is electrically connected to the first interconnection layer of the layout 100A as depicted in FIG. 9. For example, the S/D via 374 between the contact plug 358 and the conductive line 386 is electrically coupled the contact plug 358 to the conductive line 386. The ILD layer 316 may embed therein the S/D via 374. In addition, in some embodiments, the semiconductor device 100 may further comprise an intermetal dielectric (IMD) layer 390 above the ILD layer 316, and the IMD layer 390 may embed therein the conductive line 386. In the example configuration in FIG. 11, the gate via 366 is above the gate electrode 332 and between the gate electrode 332 and the conductive line 380 which is in the first interconnection layer of the layout 100A as depicted in FIG. 9. Example materials of the gate via 366 include, but are not limited to, Ti, TiN, TaN, Co, Ru, Pt, W, Al, Cu, or combinations thereof.

The semiconductor device 100 further comprises gate electrodes and gate dielectric layers. In the example configuration in FIGS. 10 and 11, the gate electrodes 330, 332, 334 wrap over the fins 312, 314, 322, 324 of the fifth and sixth active area regions 311, 321 in regions where the gate electrodes 330, 332, 334 cross over the fins 312, 314, 322, 324. To electrically isolate the gate electrodes 330, 332, 334 from the fins 312, 314, 322, 324, third gate dielectric layers 392, 394, 396 are arranged under and around the corresponding gate electrodes 330, 332, 334. The spacers 338, 340, 342, 344, 346, 348 are over opposite sides of the corresponding third gate dielectric layers 392, 394, 396. Example materials of the third gate dielectric layers 392, 394, 396 include, but are not limited to, a high-k dielectric layer, an interfacial layer, and/or combinations thereof. Example materials for the high-k dielectric layer include, but are not limited to, silicon nitride, silicon oxynitride, hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina (HfO2-Al2O3) alloy, suitable high-k dielectric materials, and/or combinations thereof. In at least one embodiment, a third gate dielectric layer includes multi-layer structure of, for example, $SiO_2$ with a high-k dielectric, or SiON with a high-k dielectric.

In some embodiments, the gate electrodes 330, 332, 334 include one or more conductive layers and/or materials. In the example configuration in FIG. 11, the gate electrode 332 is wrapped over the fins 312, 314, 322, 324, and includes a fifth conductive gate material 332a over the p-well region 310 and a sixth conductive gate material 332b over the n-well region 320. In at least one embodiment, the conductive material or materials of at least one of the fifth and sixth conductive gate materials is/are selected in accordance with the type of device or transistor. For example, each of the fifth and sixth conductive gate materials 332a and 332b includes a conductive work function layer and a contact layer over the conductive work function layer.

In at least one embodiment, the work function layer is configured to have a work function in a range from 4 eV to 5 eV. In some embodiments, the fifth conductive gate material 332a includes an n-type work function metal (n-metal) for forming an NMOS over the p-well region 310. Example n-metals include, but are not limited to, Ta, TiAl, and TiAlN. In some embodiments, the sixth conductive gate material 332b includes a p-type work function metal (p-metal) for forming a PMOS over the n-well region 320. Example p-metals include, but are not limited to, TiN, TaN, a carbon-doped metal nitride such as TaCN. Other work function materials are within the scope of various embodiments. For example, in one or more embodiments, the work function layer comprises doped conducting oxide materials, TaAl, TiSi, NiSi, PtSi, suitable Ti containing work function materials, suitable Ta containing work function materials, suitable Al containing work function materials, and suitable W containing work function materials. In at least one embodiment, conductive work function layers in the fifth conductive gate material 332a and the sixth conductive gate material 332b include the same conductive material. In at least one embodiment, conductive work function layers in the fifth conductive gate material 332a and the sixth conductive gate material 332b include different conductive materials.

In at least one embodiment, the contact layer over the conductive work function layer is configured to have a low contact resistance. Example materials of the contact layer include, but are not limited to, polysilicon with silicide, refractory materials such as TiN, TaN, TiW, and TiAl, suitable Ti containing work function materials, suitable Ta containing work function materials, suitable Al containing work function materials, suitable W containing work function materials, suitable Cu containing work function materials, and suitable N containing work function materials.

The fifth conductive gate material 332a and the sixth conductive gate material 332b are isolated from the fins 312, 314, 322, 324 by the corresponding third gate dielectric layer 394. In some embodiments, the third gate dielectric layer 394 has a first portion over the n-well region 320 and a second portion over the p-well region 310. In at least one embodiment, the first and second portions of the third gate dielectric layer 394 include the same dielectric material. In at least one embodiment, the first and second portions of the third gate dielectric layer 394 include different dielectric materials. In the example configuration in FIG. 11, the gate electrode 332 extends continuously from the n-well region 320 into the p-well region 310, and the fifth conductive gate material 332a is in contact with the sixth conductive gate material 332b. Other arrangements are within the scope of various embodiments. For example, in at least one embodiment, at least one of the first and second portions of the third gate dielectric layer 394 is interposed between and electrically isolates the fifth conductive gate material 332a and the sixth conductive gate material 332b. In at least one embodiment, at least one of the first and second portions of the third gate dielectric layer 394 includes one or more of $HfO_2$, $Ta_2O_5$ and $Al_2O_3$.

In at least one embodiment, the work function layer, the contact layer and the gate dielectric layer configure a gate stack structure. Examples of gate stack structures include, but are not limited to, a metals/high-K dielectric structure, an Al/refractory metals/high-K dielectric structure, a W/refractory metals/high-K dielectric structure, a Cu/refractory metals/high-K dielectric structure, and a silicide/high-K dielectric structure. In at least one embodiment, the gate stack structure includes a $Si_3N_4$/metals/high-K dielectric structure in which the metals are selected from the group consisting of Al/refractory metals, W/refractory metals, Cu/refractory metals, silicide, and combinations thereof. In at least one embodiment, the material and thickness of the gate dielectric layers in the first circuit 102, the second circuit 202, and the third circuit 302 are substantially the same. In at least one embodiment, the work function layers in the PMOSFETs in the first circuit 102, the second circuit 202, and the third circuit 302 have the same material composition. Yet in an alternative embodiment, the work function layers in the PMOSFETs in the first circuit 102, the second circuit 202, and the third circuit 302 have material compositions different from each other.

In the semiconductor device 100, the contact plugs are arranged in the spaces between adjacent spacers. In the example configuration in FIG. 10, the contact plug 358 is arranged in the space between adjacent spacers 340, 342. The contact plug 360 is arranged in the space between adjacent spacers 344, 346. In the example configuration in FIG. 10, top portion of the contact plug 358 and 360 are surrounded by a gate top dielectric layer 349. The material of the gate top dielectric layer 349 may be formed by a single layer or multiple layers stacked and selected from a group consist of $SiO_2$, SiOC, SiON, SiOCN, Carbon content oxide, Nitrogen content oxide, Carbon and Nitrogen content oxide, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), multiple metal content oxide, and a combination thereof. The gate top dielectric layer 349 also covers the gate electrodes 330, 332, 334. In some embodiments, the top surfaces of the contact plugs 358, 360 are flush with each other due to, e.g., a planarization process during manufacture. Other arrangements are within the scope of various embodiments.

In the semiconductor device 100, the contact plugs are in contact with corresponding source/drains. In the example configuration in FIG. 10, the fin 324 includes source/drains 326, 328 which are in contact with the corresponding contact plugs 358, 360. The source/drains 326, 328 are arranged between adjacent gate electrodes 330, 332, 334. In one or more embodiments, portions of the fin 324 between the adjacent spacers are recessed to form S/D cavities having bottom surfaces lower than the top surface of the fin 324. After the formation of the S/D cavities, the source/drains 326, 328 are produced by epi-growing a strained material in the S/D cavities. The depth of the source/drain 326, 328 is denoted as the third S/D depth D3, measured from a top surface of the fin 324 to a bottom surface of the source/drains 326, 328. In some embodiments, the third S/D depth D3 is in a range from 40 nm to 55 nm. In at least one embodiment, the lattice constant of the strained material is different from the lattice constant of the substrate 104. Examples of the strained material include, but are not limited to, SiGe, SiGeC, SiC, GeSn, SiGeSn, SiP, SiCP and other suitable materials. In at least one embodiment, the strained material for a PMOS device comprises SiGe, SiGeC, Ge, Si, or a combination thereof. In a particular example, the source/drains 326, 328 of the PMOS device is SiGe doped with Boron. In at least one embodiment, the strained material for an NMOS device comprises SiC, SiP, SiCP, Si, or a combination thereof.

In some embodiments, at least one silicide region 304 may be formed on the source/drains 326, 328. In some embodiments, at least one metal layer is formed on the corresponding source/drains 326, 328, and then it may cause a reaction between the underlying silicon and the metal material of the metal layer to form the silicide regions 304. In some embodiments, the silicide regions 304 include a material selected from titanium silicide, cobalt silicide, nickel silicide, platinum silicide, erbium silicide, or palladium silicide. In some embodiments, the source/drains 326, 328 and the corresponding silicide regions 304 may collectively have a rising shape that protrudes above the fin 324. Accordingly, the silicide regions 304 may be in a position higher than a top surface of the fin 324. For example, the top surface of the fin 324 is in contact with the third gate dielectric layers 392, 394, 396 and an interface between the silicide regions 304 and the corresponding contact plugs 358, 360 is above the top surface of the fin 324.

In the example configuration in FIG. 10, the gate electrodes 330, 332, 334 may define the third gate length. For example, the gate electrode 330 crossing over the fin 324 has the third gate length G3 along the longitudinal direction of the fin 324. In some embodiments, the gate electrodes 330, 332, 334 can be arranged along the X-direction by the third pitch P3 which can be defined by a sum of the third width and the third spacing, as depicted in FIG. 9. For example, the gate electrodes 332 and 334 are arranged along the X-direction by the third pitch P3. In some embodiments, the third pitch P3 is in a range of 40 nm to 52 nm. In some embodiments, each of the contact plugs 358, 360 respectively corresponding to the contact areas 358, 360 shown in FIG. 9 has the third contact width C3 measured along the X-direction. The third contact width C3 may be referred to as a width of a top surface of at least one of the contact plugs 358, 360. In some embodiments, a length of an interface between the contact plug 358 and the S/D via 374 is substantially the same as the third contact width C3.

In some embodiments, the third gate length G3 may be substantially the same as the first gate length G1 (i.e., G1=G3 and/or G1=G2=G3). In some embodiments, the third spacing S3 is substantially the same as the first spacing S1. In some embodiments, the third pitch P3 is substantially the same as the first pitch P1 (i.e., P1=P3 and/or P1=P3<P2). In some embodiments, the third contact width C3 is substantially the same as the first contact width C1. In some embodiments, the fin 112, 114, 122, 124 in the first and second active area regions 111, 121, the fins 212, 214, 222, 224 in the third and fourth active area regions 211, 221, the fin 312, 314, 322, 324 in the fifth and sixth active area regions 311, 321 have the same width measured along the Y-direction. The ratios stated above may be advantageous to avoid yield loss. For example, a planarization process, such as a CMP process can be performed smoothly.

Such dimension differences may be advantageous to provide various applications or functions for different circuits. For example, the third circuit 302 can be used in a SRAM bit cell, such as pull-up devices. For example, due to the same pitch in the first circuit 102 and the third circuit 302 yet different semiconductor materials in the channels (e.g., SiGe channel in the PMOSFET in the first circuit 102 and Si channel in the PMOSFET in the third circuit 302), during recessing respective fins to form S/D cavities, a relatively less etching rate may be achieved in the active area regions 311, 321 than in the active area regions 111, 121 due to an etching selectivity of the selected etchant. Consequently, the S/D cavities in the third circuit 302 are etched shallower than the S/D cavities in the first circuit 102. In another word, the third S/D depth D3 in the third circuit 302 is smaller than the first S/D depth D1 in the first circuit 102. In various embodiments, the S/D cavities etching process may be tuned to produce the first S/D depth D1 greater than the third S/D depth D3 by at least 3 nm, such as from 3 nm to 15 nm (accordingly, D2>D1>D3). The small third S/D depth D3 also leads the smallest source/drain volume in the third circuit 302 than in either the first circuit 102 or the second circuit 202, which provides the lowest strain to channels (e.g., Si channel) of the PMOS device in the third circuit 302. The lowest strain to channels of the PMOS device in the third circuit 302 in turn provides highest threshold voltage (Vt) compared to those in the first circuit 102 and the second circuit 202. This reduces channel dopant concentration and therefore have mis-match and junction leakage advantages. If the S/D depth difference is less than 3 nm, then the strain may be not low enough to support needs of low leakage circuit application. If the S/D depth difference is larger than 15 nm, over etching may harm semiconductor substrate thereunder. Accordingly, the third circuit 302 is able to be used in low leakage requirement devices, such as a pull-up device in an SRAM cell. As such, with respect to the application of the semiconductor device 100, either high speed, high circuit density, or low leakage is achieved.

Although not intended to be limiting, one or more embodiments of the present disclosure provide many benefits to a semiconductor device and the formation thereof. For example, embodiments of the present disclosure provide at least first and second circuits that can be used in the semiconductor device. Some of the dimension parameters of the first circuit are different from those of the second circuit. The dimension differences may be advantageous to provide various applications or functions for different circuits. For example, the dimension differences may be advantageous to achieve high circuit density of the first circuit and to achieve high-speed performance of the second circuit. Further, the S/D vias of the second circuit have the second contact area greater than the first contact area of the S/D vias of the first circuit, and thus resistance reduction of the second circuit is achieved. Accordingly, the second circuit is able to be used in high speed application. As such, with respect to the application of the semiconductor device, either high speed or high circuit density is achieved.

In one exemplary aspect, the present disclosure is directed to a semiconductor device. The semiconductor device includes a first transistor and a second transistor. The first transistor includes a first gate structure of a first gate pitch, a first channel region under the first gate structure, and a first source/drain (S/D) feature contacting the first channel region and having a first S/D depth. The second transistor includes a second gate structure of a second gate pitch, a second channel region under the second gate structure, and a second S/D feature contacting the second channel region and having a second S/D depth. The second gate pitch is larger than the first gate pitch. The second S/D depth is larger than the first S/D depth. In some embodiments, a ratio of the second gate pitch to the first gate pitch ranges from about 1.05 to about 1.2. In some embodiments, the second S/D depth is larger than the first S/D depth for about 3 nm to about 15 nm. In some embodiments, the first and second gate structure have a same gate length. In some embodiments, the second S/D feature has a larger volume than the first S/D feature. In some embodiments, the semiconductor device also includes a first contact plug overlapping the first S/D feature and having a first width measured along a lengthwise direction of the first channel region, and a second contact plug overlapping the second S/D feature and having a second width measured along a lengthwise direction of the second channel region. In some embodiments, the second width is larger than the first width. In some embodiments, a ratio of the second width to the first width ranges from about 1.2 to about 2. In some embodiments, the semiconductor device also includes a first via overlapping the first contact plug and having a first top surface, and a second via overlapping the second contact plug and having a second top surface. In some embodiments, the second top surface is larger than the first top surface. In some embodiments, a ratio of the second top surface to the first top surface ranges from about 1.1 to about 2. In some embodiments, the first and second transistors are of a same type, and the first and second gate structures include work function layers of different material compositions. In some embodiments, the first and second transistors are FinFET transistors.

In another exemplary aspect, the present disclosure is directed to a semiconductor device. The semiconductor device includes a first p-type FinFET transistor and a second p-type FinFET transistor. The first p-type FinFET transistor includes a first gate electrode of a first gate pitch, a first fin under the first gate electrode and extending along a direction, and a first source/drain (S/D) feature over the first fin and having a first S/D depth. The second p-type FinFET transistor includes a second gate electrode of a second gate pitch, a second fin under the second gate electrode and extending along the direction, and a second S/D feature over the second fin and having a second S/D depth. The first gate pitch equals the second gate pitch. The second S/D depth is smaller than the first S/D depth. In some embodiments, the first fin provides a SiGe channel under the first gate electrode and the second fin provides a Si channel under the second gate electrode. In some embodiments, the first fin includes a top portion comprising SiGe and a bottom portion comprising Si. In some embodiments, each of the first and second S/D features includes SiGe doped with Boron. In some embodiments, the second p-type FinFET transistor has a larger threshold voltage than the first p-type FinFET transistor. In some embodiments, the semiconductor device also includes a third p-type FinFET transistor. The third p-type FinFET transistor includes a third gate electrode of a third gate pitch, a third fin under the third gate electrode and extending along the direction, a third S/D feature over the third fin and having a third S/D depth. In some embodiments, the third gate pitch is larger than either of the first and second gate pitches. In some embodiments, the third S/D depth is larger than the first S/D depth. In some embodiments, a ratio of the third gate pitch to the first gate pitch ranges from about 1.05 to about 1.2.

In yet another exemplary aspect, the present disclosure is directed to a method. The method includes doping a substrate with a dopant to form a first well region of a first circuit and a second well region of a second circuit, forming first and second semiconductor fins respectively over the first and second well regions, forming a first gate stack across the first semiconductor fins and a second gate stack across the second semiconductor fins, and forming a first source/drain (S/D) feature adjoining the first semiconductor fin and a second S/D feature adjoining the second semiconductor fin. The first gate stack has a gate pitch less than the second gate stack. The first S/D feature has a depth smaller than the second S/D feature. In some embodiments, a ratio of the gate pitches of the second gate stack to the first gate stack ranges from about 1.05 to about 1.2.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a first transistor,
wherein the first transistor includes:
  a first gate structure of a first gate pitch;
  a first channel region under the first gate structure; and
  a first source/drain (S/D) feature contacting the first channel region and having a first S/D depth;
a second transistor having a same conductivity type as the first transistor,
wherein the second transistor includes:
  a second gate structure of a second gate pitch;
  a second channel region under the second gate structure; and
  a second S/D feature contacting the second channel region and having a second S/D depth;
a first contact plug overlapping the first S/D feature and having a first width measured along a lengthwise direction of the first channel region; and
a second contact plug overlapping the second S/D feature and having a second width measured along a lengthwise direction of the second channel region,
wherein the second width is larger than the first width,
wherein the second gate pitch is larger than the first gate pitch,
wherein the second S/D depth is larger than the first S/D depth.

2. The semiconductor device of claim 1, wherein a ratio of the second gate pitch to the first gate pitch ranges from about 1.05 to about 1.2.

3. The semiconductor device of claim 1, wherein the second S/D depth is larger than the first S/D depth for about 3 nm to about 15 nm.

4. The semiconductor device of claim 1, wherein the first and second gate structure have a same gate length.

5. The semiconductor device of claim 1, wherein the second S/D feature has a larger volume than the first S/D feature.

6. The semiconductor device of claim 1, wherein a ratio of the second width to the first width ranges from about 1.2 to about 2.

7. The semiconductor device of claim 1, further comprising:
a first via overlapping the first contact plug and having a first top surface; and
a second via overlapping the second contact plug and having a second top surface,
wherein the second top surface is larger than the first top surface.

8. The semiconductor device of claim 7, wherein a ratio of the second top surface to the first top surface ranges from about 1.1 to about 2.

9. The semiconductor device of claim 1, wherein the first and second gate structures include work function layers of different material compositions.

10. The semiconductor device of claim 1, wherein the first and second transistors are FinFET transistors.

11. A semiconductor device, comprising:
a first p-type FinFET transistor,
wherein the first p-type FinFET transistor includes:
  a first gate electrode of a first gate pitch;
  a first fin under the first gate electrode and extending along a direction; and
  a first source/drain (S/D) feature over the first fin and having a first S/D depth; and
a second p-type FinFET transistor, wherein the second p-type FinFET transistor includes:
a second gate electrode of a second gate pitch;
a second fin under the second gate electrode and extending along the direction; and
a second S/D feature over the second fin and having a second S/D depth,
wherein the first gate pitch equals the second gate pitch,
wherein the second S/D depth is smaller than the first S/D depth.

12. The semiconductor device of claim 11, wherein the first fin provides a SiGe channel under the first gate electrode and the second fin provides a Si channel under the second gate electrode.

13. The semiconductor device of claim 12, wherein the first fin includes a top portion comprising SiGe and a bottom portion comprising Si.

14. The semiconductor device of claim 11, wherein each of the first and second S/D features includes SiGe doped with Boron.

15. The semiconductor device of claim 11, wherein the second p-type FinFET transistor has a larger threshold voltage than the first p-type FinFET transistor.

16. The semiconductor device of claim 11, further comprising:
a third p-type FinFET transistor,
wherein the third p-type FinFET transistor includes:
a third gate electrode of a third gate pitch;
a third fin under the third gate electrode and extending along the direction; and
a third S/D feature over the second fin and having a third S/D depth,
wherein the third gate pitch is larger than either of the first and second gate pitches,
wherein the third S/D depth is larger than the first S/D depth.

17. The semiconductor device of claim 16, wherein a ratio of the third gate pitch to the first gate pitch ranges from about 1.05 to about 1.2.

18. A semiconductor device, comprising:
a first transistor of a first conductivity type, wherein the first transistor includes:
a first gate electrode of a first gate pitch;
a first channel under the first gate electrode and extending along a first direction;
a first epitaxial feature abutting the first channel and having a first depth; and
a first contact plug overlying the first epitaxial feature and having a first width measured along the first direction; and
a second transistor of the first conductivity type, wherein the second transistor includes:
a second gate electrode of a second gate pitch;
a second channel under the second gate electrode and extending along the first direction;
a second epitaxial feature abutting the second channel and having a second depth; and
a second contact plug overlying the second epitaxial feature and having a second width measured along the first direction,
wherein the first and second gate electrodes include work function layers of different material compositions,
wherein the first gate pitch is smaller than the second gate pitch,
wherein the first depth is smaller than the second depth, and
wherein the first width is smaller than the second width.

19. The semiconductor device of claim 18, wherein a ratio of the second gate pitch to the first gate pitch ranges from about 1.05 to about 1.2.

20. The semiconductor of claim 18, further comprising:
a first via overlying the first contact plug and having a first top surface; and
a second via overlying the second contact plug and having a second top surface,
wherein the second top surface is larger than the first top surface.

* * * * *